US009553100B2

(12) United States Patent
Kamiya et al.

(10) Patent No.: US 9,553,100 B2
(45) Date of Patent: Jan. 24, 2017

(54) SELECTIVE FLOATING GATE SEMICONDUCTOR MATERIAL DEPOSITION IN A THREE-DIMENSIONAL MEMORY STRUCTURE

(71) Applicant: SanDisk Technologies, Inc., Plano, TX (US)

(72) Inventors: Hiroyuki Kamiya, Yokkaichi (JP); Kensuke Yamaguchi, Yokkaichi (JP)

(73) Assignee: SANDISK TECHOLOGIES LLC, Plano, TX (US)

( * ) Notice: Subject to any disclaimer, the term of this patent is extended or adjusted under 35 U.S.C. 154(b) by 60 days.

(21) Appl. No.: 14/560,351

(22) Filed: Dec. 4, 2014

(65) Prior Publication Data

US 2016/0163725 A1    Jun. 9, 2016

(51) Int. Cl.
*H01L 27/11*     (2006.01)
*H01L 27/115*    (2006.01)
(Continued)

(52) U.S. Cl.
CPC ..... *H01L 27/11556* (2013.01); *H01L 21/0206* (2013.01); *H01L 21/0217* (2013.01);
(Continued)

(58) Field of Classification Search
None
See application file for complete search history.

(56) References Cited

U.S. PATENT DOCUMENTS 5,807,788 A    9/1998 Brodsky et al.
5,915,167 A    6/1999 Leedy
(Continued)

FOREIGN PATENT DOCUMENTS

WO    WO02/15277 A2    2/2002

OTHER PUBLICATIONS

International Search Report and Written Opinion for International Application No. PCT/US2015/053584, issued Feb. 24, 2016, 21 pages.

(Continued)

*Primary Examiner* — Charles Garber
*Assistant Examiner* — Alia Sabur
(74) *Attorney, Agent, or Firm* — The Marbury Law Group PLLC

(57) ABSTRACT

A method of forming a three-dimensional memory device includes forming a stack of alternating first and second material layers over a substrate, forming a memory opening through the stack, forming a memory film and a semiconductor channel in the memory opening, and forming backside recesses by removing the second material layers selective to the first material layers and the memory film, where an outer sidewall of the memory film is physically exposed within each backside recess. The method also includes forming at least one set of surfaces selected from silicon deposition inhibiting surfaces on the first material layers and silicon deposition promoting surfaces over the memory film in the back side recesses, selectively growing a silicon-containing semiconductor portion laterally within each backside recess, forming at least one blocking dielectric within the backside recesses, and forming conductive material layers by depositing a conductive material within the backside recesses.

26 Claims, 18 Drawing Sheets

(51) Int. Cl.
  *H01L 21/02* (2006.01)
  *H01L 21/28* (2006.01)
  *H01L 21/3065* (2006.01)
  *H01L 29/423* (2006.01)
  *H01L 29/788* (2006.01)

(52) U.S. Cl.
  CPC ...... *H01L 21/0223* (2013.01); *H01L 21/0262* (2013.01); *H01L 21/02164* (2013.01); *H01L 21/02247* (2013.01); *H01L 21/02422* (2013.01); *H01L 21/02532* (2013.01); *H01L 21/02592* (2013.01); *H01L 21/02636* (2013.01); *H01L 21/02639* (2013.01); *H01L 21/28273* (2013.01); *H01L 21/28282* (2013.01); *H01L 21/3065* (2013.01); *H01L 27/11519* (2013.01); *H01L 27/11521* (2013.01); *H01L 27/11582* (2013.01); *H01L 29/42324* (2013.01); *H01L 29/7883* (2013.01); *H01L 21/02252* (2013.01); *H01L 21/02255* (2013.01)

(56) References Cited

U.S. PATENT DOCUMENTS

| | | | |
|---|---|---|---|
| 7,177,191 | B2 | 2/2007 | Fasoli et al. |
| 7,221,588 | B2 | 5/2007 | Fasoli et al. |
| 7,233,522 | B2 | 6/2007 | Chen et al. |
| 7,378,353 | B2 | 5/2008 | Lee et al. |
| 7,514,321 | B2 | 4/2009 | Mokhlesi et al. |
| 7,575,973 | B2 | 8/2009 | Mokhlesi et al. |
| 7,608,195 | B2 | 10/2009 | Wilson |
| 7,648,872 | B2 | 1/2010 | Benson |
| 7,745,265 | B2 | 6/2010 | Mokhlesi et al. |
| 7,745,312 | B2 | 6/2010 | Herner et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi |
| 8,053,829 | B2 | 11/2011 | Kang et al. |
| 8,093,725 | B2 | 1/2012 | Wilson |
| 8,187,936 | B2 | 5/2012 | Alsmeier et al. |
| 8,193,054 | B2 | 6/2012 | Alsmeier |
| 8,198,672 | B2 | 6/2012 | Alsmeier |
| 8,283,228 | B2 | 10/2012 | Alsmeier |
| 8,349,681 | B2 | 1/2013 | Alsmeier et al. |
| 8,415,742 | B2 | 4/2013 | Kim et al. |
| 2006/0102586 | A1 | 5/2006 | Lee et al. |
| 2007/0210338 | A1 | 9/2007 | Orlowski |
| 2007/0252201 | A1 | 11/2007 | Kito et al. |
| 2009/0096009 | A1 | 4/2009 | Dong et al. |
| 2010/0044778 | A1 | 2/2010 | Seol |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho |
| 2010/0181610 | A1 | 7/2010 | Kim et al. |
| 2010/0207195 | A1 | 8/2010 | Fukuzumi et al. |
| 2010/0320528 | A1 | 12/2010 | Jeong et al. |
| 2011/0076819 | A1 | 3/2011 | Kim et al. |
| 2011/0133606 | A1 | 6/2011 | Yoshida et al. |
| 2011/0266606 | A1 | 11/2011 | Park et al. |
| 2012/0001247 | A1 | 1/2012 | Alsmeier |
| 2012/0001249 | A1* | 1/2012 | Alsmeier .......... H01L 27/11551 257/319 |
| 2012/0112260 | A1* | 5/2012 | Kim .................. H01L 27/11556 257/315 |
| 2012/0181596 | A1* | 7/2012 | Liu ................... H01L 27/11565 257/316 |
| 2012/0256247 | A1 | 10/2012 | Alsmeier |
| 2012/0267699 | A1* | 10/2012 | Kiyotoshi ......... H01L 27/11524 257/319 |
| 2013/0122712 | A1 | 5/2013 | Kim et al. |
| 2013/0164907 | A1 | 6/2013 | Lee |
| 2013/0171787 | A1 | 7/2013 | Jeon et al. |
| 2013/0200450 | A1* | 8/2013 | Kusai ............... H01L 29/66833 257/324 |
| 2013/0224960 | A1 | 8/2013 | Payyapilly et al. |
| 2013/0248974 | A1 | 9/2013 | Alsmeier et al. |
| 2013/0264631 | A1 | 10/2013 | Alsmeier et al. |
| 2013/0273704 | A1 | 10/2013 | Jee et al. |
| 2013/0313627 | A1 | 11/2013 | Lee et al. |
| 2014/0008714 | A1 | 1/2014 | Makala et al. |
| 2014/0070300 | A1* | 3/2014 | Jang ................. H01L 27/11565 257/324 |
| 2014/0225181 | A1* | 8/2014 | Makala ............. H01L 29/7889 257/321 |
| 2014/0339621 | A1* | 11/2014 | Simsek-Ege ...... H01L 29/66825 257/316 |

OTHER PUBLICATIONS

Invitation to Pay Additional Fees for International Application No. PCT/US2015/053584, issued Dec. 17, 2015, 7 pages.

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Tanaka et al., "Bit-Cost Scalable Technology for Low-Cost and Ultrahigh-Density Flash Memory," Toshiba Review, vol. 63, No. 2, 2008, pp. 28-31.

Masahide Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.

Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).

Whang et al., "Novel 3-Dimensional Dual Control-Gate with Surrounding Floating-Gate (DC-SF) NAND Flash Cell for 1Tb File Storage Application", IEDM-2010 Proceedings, Dec. 6-8, 2010, pp. 668-671.

Y.S. Kim et al., "Direct Copper Electroless Deposition on a Tungsten Barrier Layer for Ultralarge Scale Integration," Journal of the Electrochemical Society, vol. 152 (2) 2005.

Au, Y. et al., "Filling Narrow Trenches by Iodine-Catalyzed CVD of Copper and Manganese on Manganese Nitride Barrier/Adhesion Layers," Journal of the Electrochemical Society, vol. 158 (5) 2011.

K. R. Williams et al., "Etch Rates for Micromachining Processing," Journal of Microelectromechanical Systems, vol. 5, No. 4, Dec. 1996.

K. R. Williams et al., "Etch Rates for Micromachining Processing Part II," Journal of the Microelectromechanical Systems, vol. 12, No. 6, Dec. 2003.

M. Claes et al., "Selective Wet Etching of Hf-based Layers," Abstracts, 204th Meeting of the Electrochemical Society, 2003.

U.S. Appl. No. 13/762,988, filed Feb. 8, 2013, SanDisk Technologies Inc.

(56) References Cited

OTHER PUBLICATIONS

U.S. Appl. No. 14/133,979, filed Dec. 19, 2013, SanDisk Technologies Inc.
U.S. Appl. No. 14/183,152, filed Feb. 18, 2014, SanDisk Technologies Inc.
U.S. Appl. No. 14/219,161, filed Mar. 19, 2014, SanDisk Technologies Inc.
U.S. Appl. No. 14/225,116, filed Mar. 25, 2014, SanDisk Technologies Inc.
U.S. Appl. No. 14/225,176, filed Mar. 25, 2014, SanDisk Technologies Inc.
U.S. Appl. No. 14/264,262, filed Apr. 29, 2014, SanDisk Technologies Inc.
U.S. Appl. No. 14/264,312, filed Apr. 29, 2014, SanDisk Technologies Inc.
U.S. Appl. No. 14/264,407, filed Apr. 29, 2014, SanDisk Technologies Inc.
U.S. Appl. No. 14/282,567, filed May 20, 2014, SanDisk Technologies Inc.
U.S. Appl. No. 14/319,283, filed Jun. 30, 2014, SanDisk Technologies Inc.
U.S. Appl. No. 14/456,515, filed Aug. 11, 2014, SanDisk Technologies Inc.
U.S. Appl. No. 14/560,308, filed Dec. 4, 2014, SanDisk Technologies Inc.
U.S. Appl. No. 14/560,444, filed Dec. 4, 2014, SanDisk Technologies Inc.
Endoh, et al., "Novel Ultra High Density Memory with a Stacked-Surrounding Gate Transistor (S-SGT) Structured Cell," IEDM Proc. (2001) 33-36.

\* cited by examiner

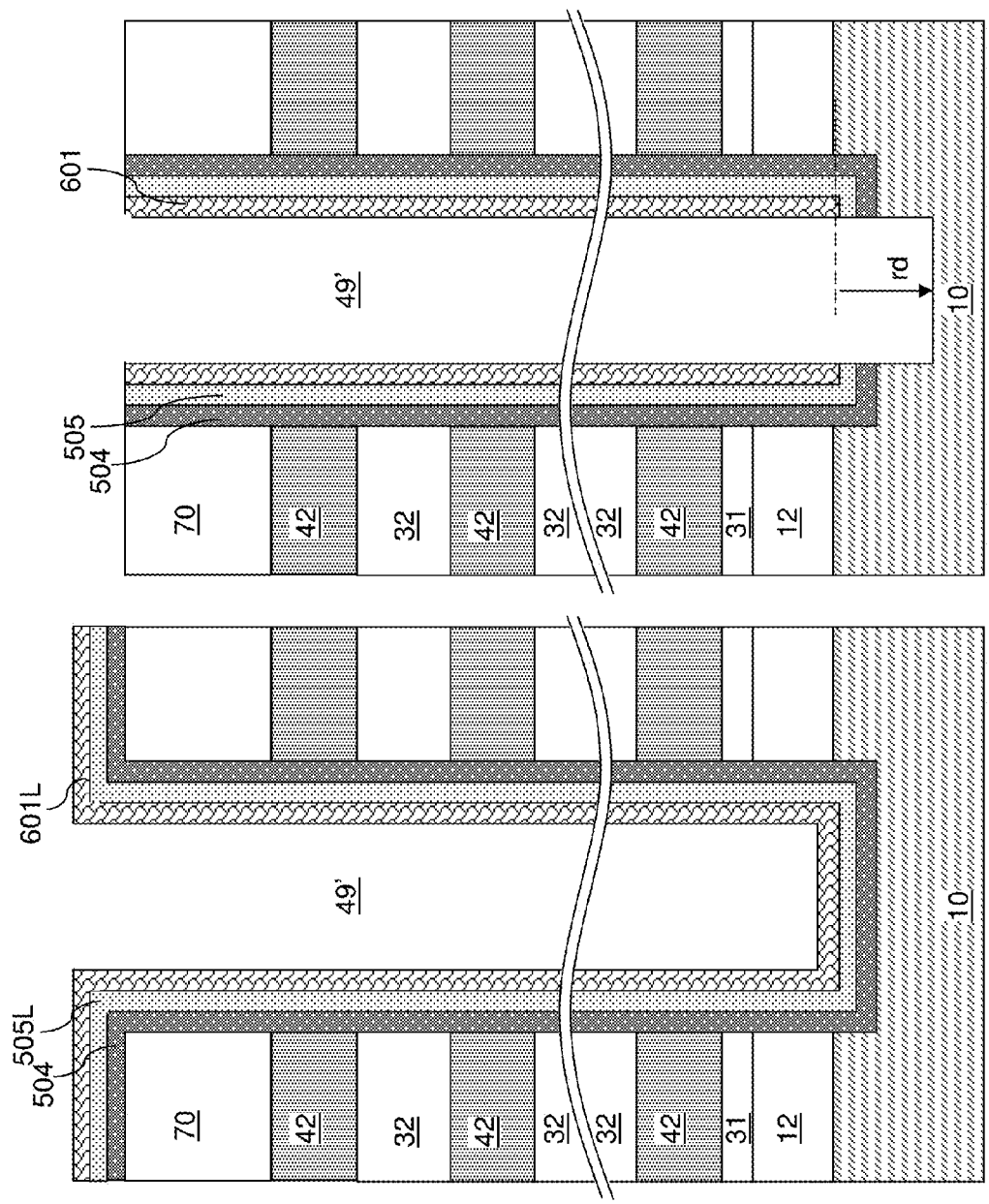

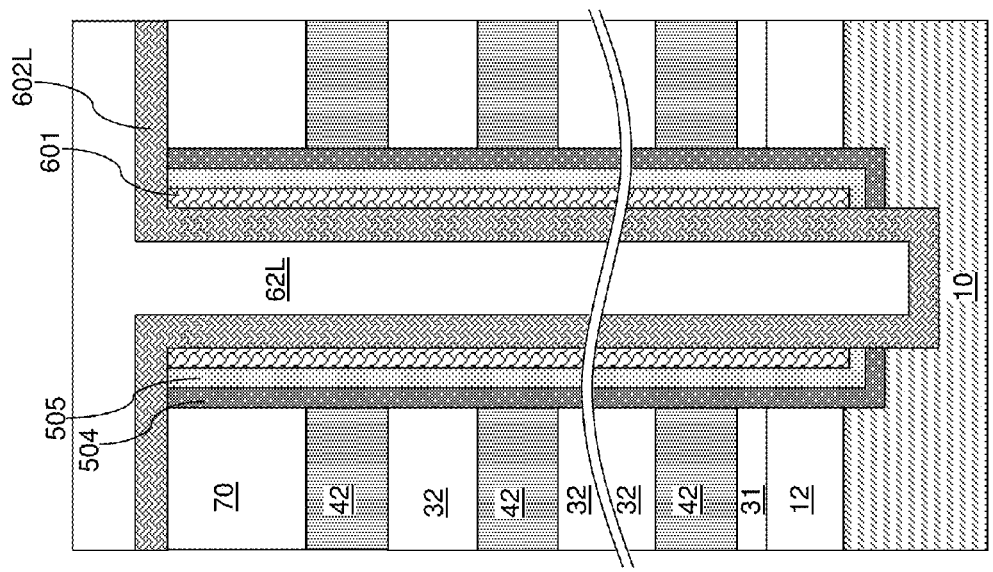
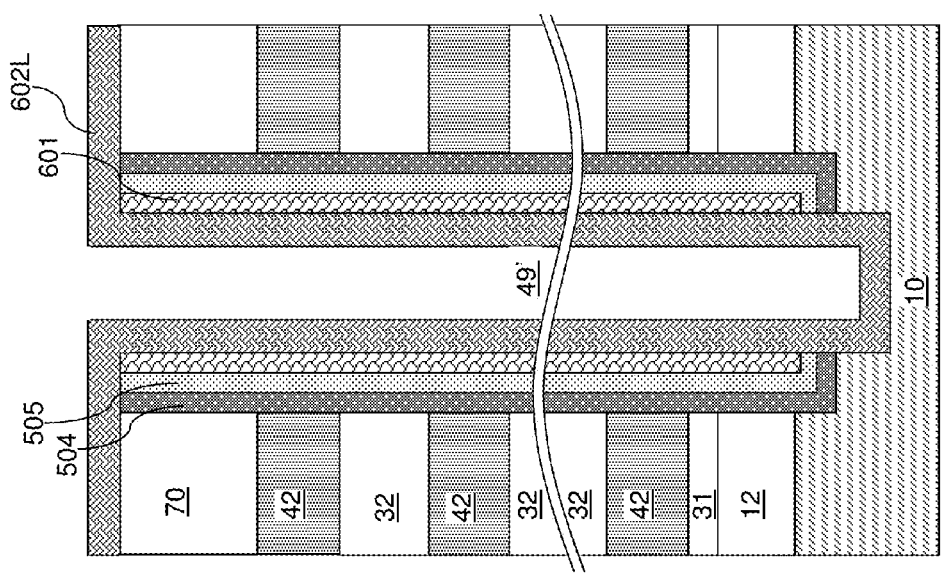

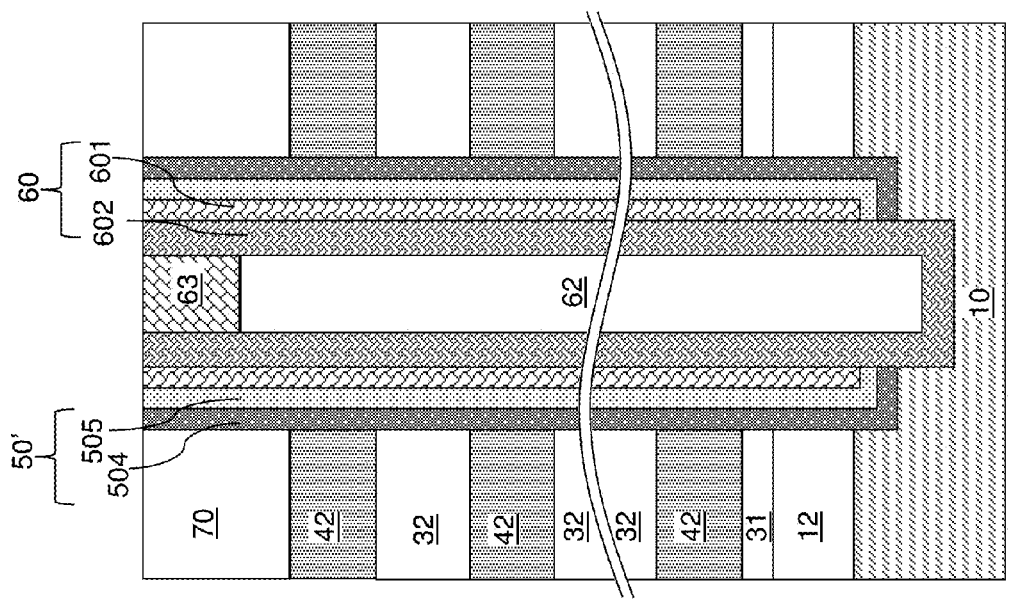
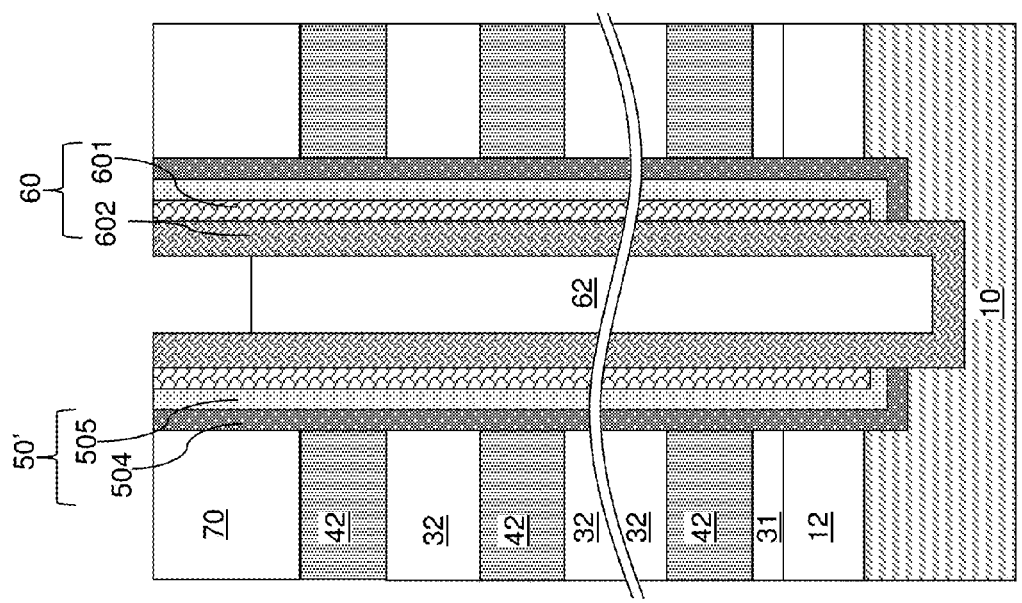

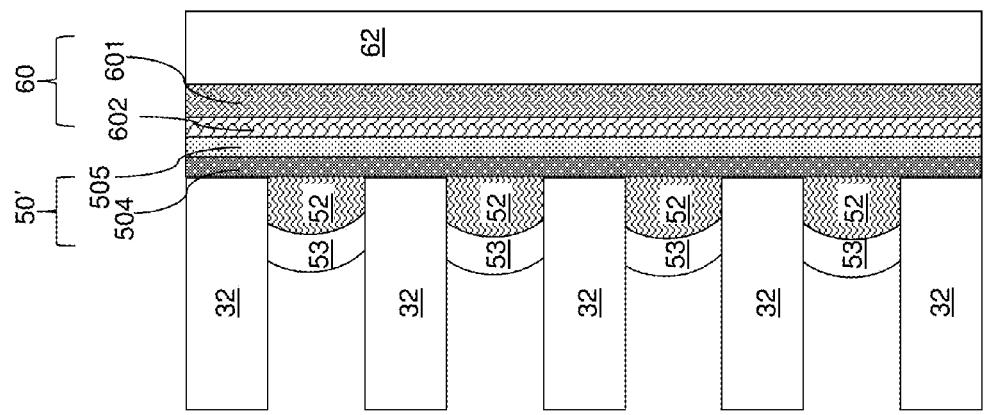
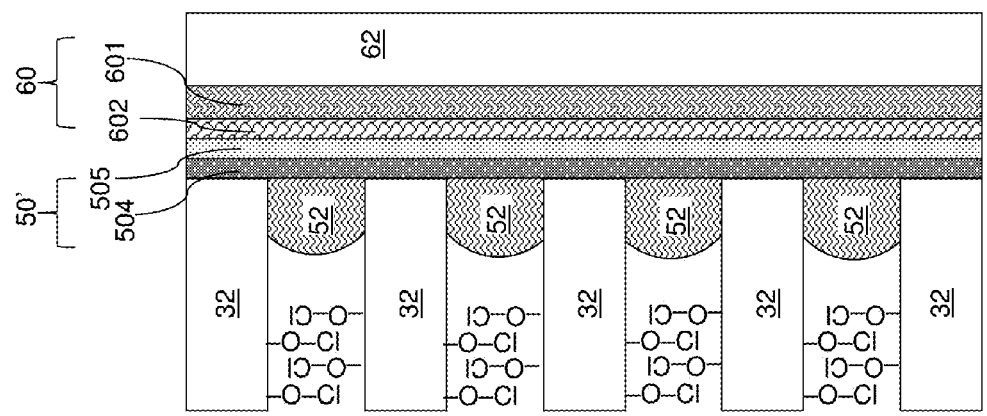

SELECTIVE FLOATING GATE SEMICONDUCTOR MATERIAL DEPOSITION IN A THREE-DIMENSIONAL MEMORY STRUCTURE

FIELD

The present disclosure relates generally to the field of semiconductor devices and specifically to three-dimensional memory structures, such as vertical NAND strings and other three-dimensional devices, and methods of making thereof.

BACKGROUND

Three-dimensional vertical NAND strings having one bit per cell are disclosed in an article by T. Endoh, et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a method of forming a three-dimensional memory device is provided. A stack of alternating layers comprising first material layers and second material layers is formed over a substrate. A memory opening is formed through the stack. A memory film and a semiconductor channel are formed in the memory opening. Backside recesses are formed by removing the second material layers selective to the first material layers and the memory film. An outer sidewall of the memory film is physically exposed within each backside recess. A silicon-containing semiconductor portion is formed on the memory film within each backside recess. An outer portion of each silicon-containing semiconductor portion is converted into a dielectric material portion. A remaining portion of each silicon-containing semiconductor portion constitutes a floating gate electrode for the three-dimensional memory device. Conductive material layers are formed by depositing a conductive material within the backside recesses.

According to another aspect of the present disclosure, a method of manufacturing a structure is provided. An initial structure comprising a dielectric material portion and a silicon-containing semiconductor portion located over a substrate is provided. Exposed surfaces of the dielectric material portion and the silicon-containing semiconductor portion are terminated with chlorine to form an —SiCl terminated semiconductor surface on the silicon-containing semiconductor portion and to form an —OCl terminated dielectric surface on the dielectric material portion. The —SiCl terminated semiconductor surface and the —OCl terminated dielectric surface are exposed to an aminosilane gas to convert the —SiCl terminated semiconductor surface to an —SiSiH$_3$ terminated semiconductor surface while the dielectric surface remains —OCl terminated. Additional silicon-containing semiconductor material is selectively grown on the —SiSiH$_3$ terminated semiconductor surface while the additional silicon-containing semiconductor material is not deposited on the —OCl terminated dielectric surface.

According to another aspect of the present disclosure, a method of manufacturing a structure is provided. An —NH terminated first dielectric surface and an —OH terminated second dielectric surface are provided over a substrate. The first dielectric surface and the second dielectric surface are exposed to a silylation agent containing an —Si(CH3)$_3$ group to convert the —OH terminated second dielectric surface to an —OSi(CH3)$_3$ terminated second dielectric surface without converting the —NH termination of the first dielectric surface. A silicon-containing semiconductor material is selectively grown on the —NH terminated first dielectric surface while the silicon-containing semiconductor material is not deposited on the —OSi(CH3)$_3$ terminated second dielectric surface.

According to even another aspect of the present disclosure, a method of forming a three-dimensional memory device is provided. A stack of alternating layers comprising first material layers and second material layers is formed over a substrate. A memory opening is formed through the stack. A memory film and a semiconductor channel are formed in the memory opening. Backside recesses are formed by removing the second material layers selective to the first material layers and the memory film. An outer sidewall of the memory film is physically exposed within each backside recess. At least one set of surfaces is formed, which is selected from silicon deposition inhibiting surfaces on the first material layers and silicon deposition promoting surfaces over the memory film in the back side recesses. A silicon-containing semiconductor portion is selectively grown laterally within each backside recess. At least one blocking dielectric is formed within the backside recesses. Conductive material layers are formed by depositing a conductive material within the backside recesses.

According to yet another aspect of the present disclosure, a monolithic three-dimensional NAND memory device is provided, which comprises a stack of alternating layers comprising electrically insulating layers and electrically conductive layers and located over a substrate, a memory opening extending through the stack, a memory film and a semiconductor channel located within the memory opening, a plurality of vertically spaced semiconductor floating gate electrodes, wherein each floating gate electrode has a vertical inner sidewall and a curved outer sidewall, and a plurality of blocking dielectrics located between respective floating gate electrodes and electrically conductive layers in each device level.

BRIEF DESCRIPTION OF THE DRAWINGS

FIGS. 2A-2F are sequential vertical cross-sectional views of a memory opening within the exemplary structure during various processing steps employed to form a memory stack structure according to an embodiment of the present disclosure.

FIGS. 6A-6G are sequential vertical cross-sectional views of the exemplary structure during formation of silicon-containing semiconductor portions and electrically conductive lines according to a first embodiment of the present disclosure.

DETAILED DESCRIPTION

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays.

The various three-dimensional memory devices of the present disclosure include a monolithic three-dimensional NAND string memory device, and can be fabricated employing the various embodiments described herein.

Figure 1:
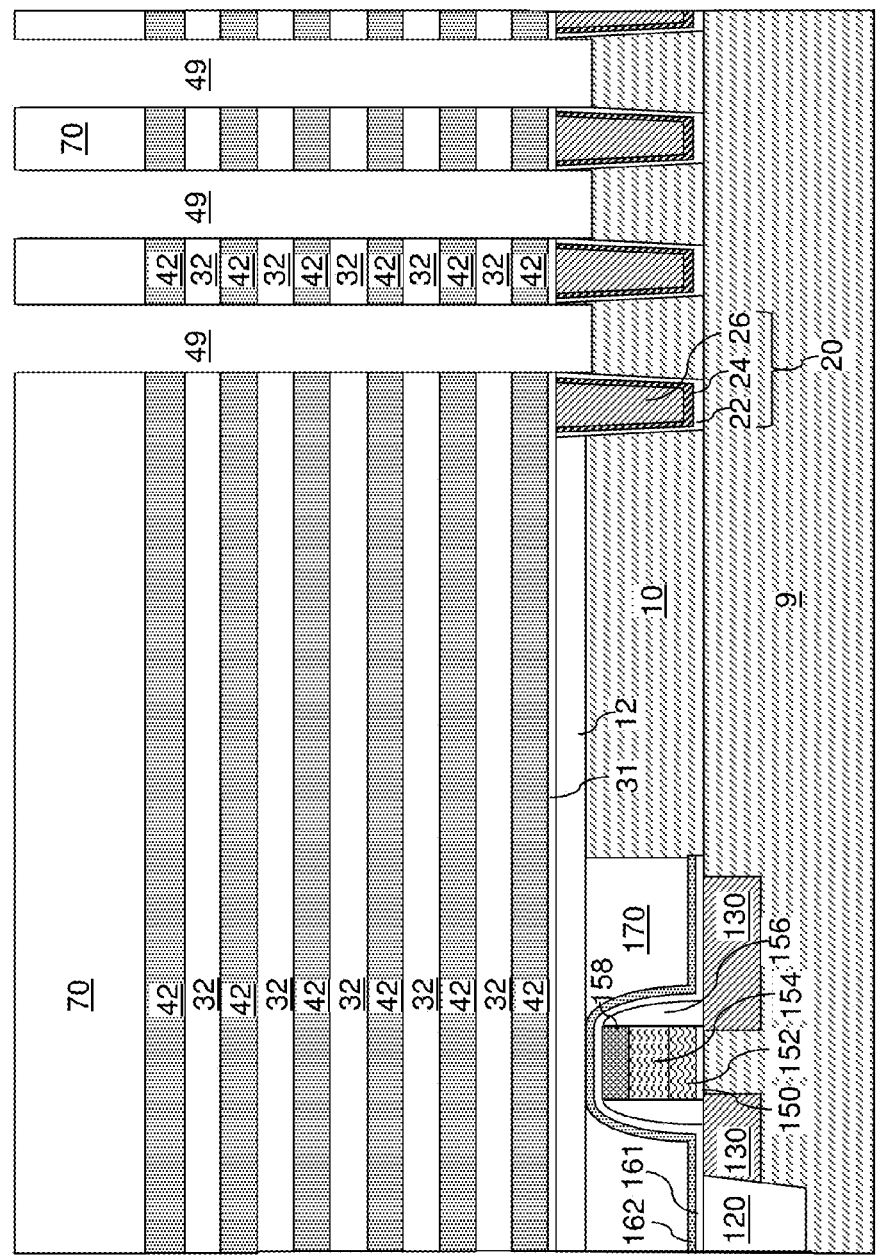
FIG. 1 is a vertical cross-sectional view of an exemplary structure after formation of a stack including an alternating plurality of material layers and memory openings extending through the stack according to an embodiment of the present disclosure.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate. The substrate can include a substrate semiconductor layer 9. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface.

As used herein, a "semiconductor material" refers to a material having electrical conductivity in the range from $1.0 \times 10^{-6}$ S/cm to $1.0 \times 10^{5}$ S/cm, and is capable of producing a doped material having electrical resistivity in a range from 1.0 S/cm to $1.0 \times 10^{5}$ S/cm upon suitable doping with an electrical dopant. As used herein, an "electrical dopant" refers to a p-type dopant that adds a hole to a balance band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 9.

At least one semiconductor device for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 70 can be removed, for example, by chemical mechanical planarization (CMP). In this case, the semiconductor material layer 10 can have a top surface that is coplanar with the top surface of the planarization dielectric layer 170.

Optionally, a dielectric pad layer 12 can be formed above the semiconductor material layer 10 and the planarization dielectric layer 170. The dielectric pad layer 12 can be, for example, silicon oxide layer. The thickness of the dielectric pad layer 12 can be in a range from 3 nm to 30 nm, although lesser and greater thicknesses can also be employed.

At least one optional shallow trench can be formed through the dielectric pad layer 12 and an upper portion of the semiconductor material layer 10. The pattern of the at least one shallow trench can be selected such that lower select gate electrodes can be subsequently formed therein. For example, a lower select gate device level may be fabricated as described in U.S. patent application Ser. No. 14/133,979, filed on Dec. 19, 2013, U.S. patent application Ser. No. 14/225,116, filed on Mar. 25, 2014, and/or U.S. patent application Ser. No. 14/225,176, filed on Mar. 25, 2014, all of which are incorporated herein by reference.

A lower select gate structure 20 can be formed in each of the at least one shallow trench, for example, by forming a gate dielectric layer and at least one conductive material layer, and removing portions of the gate dielectric layer and the at least one conductive material layer from above the top surface of the dielectric pad layer 12, for example, by chemical mechanical planarization. Each lower select gate structure 20 can include a gate dielectric 22 and a gate electrode (24, 26). In one embodiment, each gate electrode (24, 26) can include a metallic liner 24 and a conductive material portion 26. The metallic liner 24 can include, for example, TiN, TaN, WN, or a combination thereof. The conductive material portion 26 can include, for example, W, Al, Cu, or combinations thereof. At least one optional shallow trench isolation structure (not shown) and/or at least one deep trench isolation structure (not shown) may be employed to provide electrical isolation among various semiconductor devices that are present, or are to be subsequently formed, on the substrate.

A dielectric cap layer 31 can be optionally formed. The dielectric cap layer 31 includes a dielectric material, and can be formed directly on top surfaces of the gate electrodes (24, 26). Exemplary materials that can be employed for the dielectric cap layer 31 include, but are not limited to, silicon oxide, a dielectric metal oxide, and silicon nitride (in case the material of second material layers to be subsequently formed is not silicon nitride). The dielectric cap layer 31 provides electrical isolation for the gate electrodes (24, 26).

A stack of an alternating plurality of first material layers (which can be insulating layers 32) and second material layers (which can be sacrificial material layer 42) is formed over the top surface of the substrate, which can be, for example, on the top surface of the dielectric cap layer 31. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulator layer 32, and each second material layer can be a sacrificial material layer. In this case, the stack can include an alternating plurality of insulator layers 32 and sacrificial material layers 42.

The stack of the alternating plurality is herein referred to as an alternating stack (32, 42). In one embodiment, the alternating stack (32, 42) can include insulator layers 32 composed of the first material, and sacrificial material layers 42 composed of a second material different from that of insulator layers 32. The first material of the insulator layers 32 can be at least one electrically insulating material. As such, each insulator layer 32 can be an electrically insulating material layer. Electrically insulating materials that can be employed for the insulator layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulator layers 32 can be silicon oxide.

The second material of the sacrificial material layers 42 is a sacrificial material that can be removed selective to the first material of the insulator layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an electrically insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be material layers that comprise silicon nitride or a semiconductor material including at least one of silicon and germanium.

In one embodiment, the insulator layers 32 can include silicon oxide, and sacrificial material layers can include silicon nitride sacrificial material layers. The first material of the insulator layers 32 can be deposited, for example, by chemical vapor deposition (CVD). For example, if silicon oxide is employed for the insulator layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulator layers 32 and the sacrificial material layers 42 can be in a range from 20 nm to 50 nm, although lesser and greater thicknesses can be employed for each insulator layer 32 and for each sacrificial material layer 42. The number of repetitions of the pairs of an insulator layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulator layers 32 as described above. The insulating cap layer 70 can have a greater thickness than each of the insulator layers 32. The insulating cap layer 70 can be deposited, for example, by chemical vapor deposition. In one embodiment, the insulating cap layer 70 can be a silicon oxide layer.

Subsequently, a lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the dielectric cap layer 31 may be used as an etch stop layer between the alternating stack (32, 42) and the substrate. The sidewalls of the memory openings 49 can be substantially vertical, or can be tapered. The patterned lithographic material stack can be subsequently removed, for example, by ashing.

The memory openings 49 are formed through the dielectric cap layer 31 and the dielectric pad layer 12 so that the memory openings 49 extend from the top surface of the alternating stack (32, 42) to the top surface of the semiconductor material layer 10 within the substrate between the lower select gate electrodes (24, 26). In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the semiconductor material layer 10.

A memory stack structure can be formed in each of the memory opening employing various embodiments of the present disclosure. FIGS. 2A-2F illustrate sequential vertical cross-sectional views of a memory opening within the exemplary structure during formation of an exemplary memory stack structure according to a first embodiment of the present disclosure. Formation of the exemplary memory stack structure can be performed within each of the memory openings 49 in the exemplary structure illustrated in FIG. 1.

Referring to FIG. 2A, a memory opening 49 is illustrated. The memory opening 49 extends through the insulating cap layer 70, the alternating stack (32, 42), the dielectric cap layer 31, the dielectric pad layer 12, and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

A set of layers including a memory material layer 504, a tunneling dielectric layer 505L, and an optional first semiconductor channel layer 601L can be sequentially deposited in the memory openings 49. In one embodiment, the memory material layer 504 can be a charge trapping material including a dielectric charge trapping material, which can be, for example, silicon nitride. Alternatively, the memory material layer 504 can include a conductive material such as doped polysilicon or a metallic material that is patterned into multiple electrically isolated portions (e.g., floating gates), for example, by being formed within lateral recesses into sacrificial material layers 42. In one embodiment, the memory material layer 504 includes a silicon nitride layer.

The memory material layer 504 can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 504 may comprise an insulating charge trapping material, such as one or more silicon nitride segments. Alternatively, the memory material layer 504 may comprise conductive nanoparticles such as metal nanoparticles, which can be, for example, ruthenium nanoparticles. The memory material layer 504 can be formed, for example, by chemical vapor deposition (CVD), atomic layer deposition (ALD), physical vapor deposition (PVD), or any suitable deposition technique for storing electrical charges therein. The thickness of the memory material layer 504 can be in a range from 2 nm to 20 nm, although lesser and greater thicknesses can also be employed.

The tunneling dielectric layer 505L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 505L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 505L can include a stack of a first silicon oxide layer, a silicon oxynitride layer, and a second silicon oxide layer, which is commonly known as an ONO stack. In one embodiment, the tunneling dielectric layer 505L can include a silicon oxide layer that is substantially free of carbon or a silicon oxynitride layer that is substantially free of carbon. The thickness of the tunneling dielectric layer 505L can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (504L, 505l, 601L).

Referring to FIG. 2B, the optional first semiconductor channel layer 601L, the tunneling dielectric layer 505L, and the memory material layer 504 are sequentially anisotropically etched employing at least one anisotropic etch process. The portions of the first semiconductor channel layer 601L, the tunneling dielectric layer 505L, and the memory material layer 504 located above the top surface of the insulating cap layer 70 can be removed by the at least one anisotropic etch process. Further, the horizontal portions of the first semiconductor channel layer 601L, the tunneling dielectric layer 505L, and the memory material layer 504 at a bottom of each cavity 49' can be removed to form openings in remaining portions thereof. Each of the first semiconductor channel layer 601L, the tunneling dielectric layer 505L, and the memory material layer 504 can be etched by anisotropic etch process.

Each remaining portion of the first semiconductor channel layer 601L constitutes a first semiconductor channel portion 601. Each remaining portion of the tunneling dielectric layer 505L constitutes a tunneling dielectric 505. Each remaining portion of the memory material layer 504 constitutes a plurality of charge storage elements for a memory stack structure. In one embodiment, the memory material layer 504 can be a contiguous layer, i.e., can be a charge storage layer. A surface of the semiconductor material layer 10 can be physically exposed underneath the opening through the first semiconductor channel portion 601, the tunneling dielectric 505, and the memory material layer 504. Optionally, the physically exposed semiconductor surface at the bottom of each cavity 49' can be vertically recessed so that the recessed semiconductor surface underneath the cavity 49' is vertically offset from the topmost surface of the semiconductor material layer 10 by a recess distance rd. A tunneling dielectric 505 is embedded within a memory material layer 504. The memory material layer 504 can comprise a charge trapping material or a floating gate material.

In one embodiment, the first semiconductor channel portion 601, the tunneling dielectric 505, and the memory material layer 504 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Referring to FIG. 2C, a second semiconductor channel layer 602L can be deposited directly on the semiconductor surface of the semiconductor material layer 10 in the substrate (9, 10), and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Referring to FIG. 2D, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 2E, the horizontal portion of the dielectric core layer 62L can be removed, for example, by a recess etch from above the top surface of the insulating cap layer 70. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. A tunneling dielectric 505 is embedded within a memory material layer 504, and laterally surrounds a portion of the semiconductor channel 60. Each adjoining set of a memory material layer 504, and a tunneling dielectric 505 collectively constitute a memory film 50', which can store electrical charges with a macroscopic retention time. As used herein, a macroscopic retention time refers to a retention time suitable for operation of a memory device as a permanent memory device such as a retention time in excess of 24 hours.

The top surface of the remaining portion of the dielectric core layer 62L can be further recessed within each memory opening, for example, by a recess etch to a depth that is located between the top surface of the insulating cap layer 70 and the bottom surface of the insulating cap layer 70. Each remaining portion of the dielectric core layer 62L constitutes a dielectric core 62.

Referring to FIG. 2F, drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Figure 3:
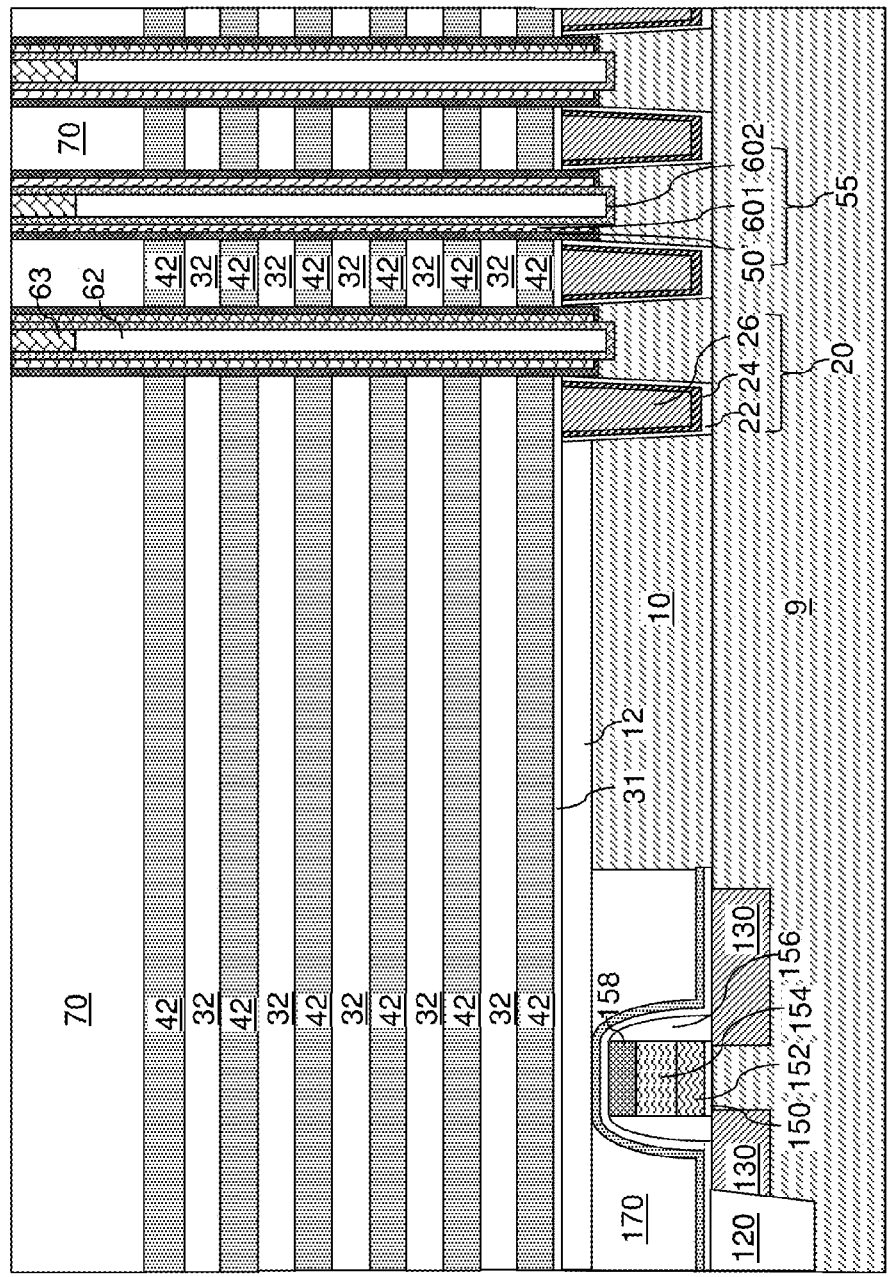
FIG. 3 is a vertical cross-sectional view of the exemplary structure after formation of memory stack structures according to an embodiment of the present disclosure.

The exemplary memory stack structure can be embedded into the exemplary structure illustrated in FIG. 1. FIG. 3 illustrates the exemplary structure that incorporates multiple instances of the exemplary memory stack structure of FIG. 2F. The exemplary structure includes a semiconductor device, which comprises a stack (32, 42) including an alternating plurality of material layers (e.g., the sacrificial material layers 42) and insulator layers 32 located over a semiconductor substrate (9, 10), and a memory opening extending through the stack (32, 42). While the present disclosure is described employing the illustrated configuration for the memory stack structure, the methods of the present disclosure can be applied to alternative memory stack structures including a polycrystalline semiconductor channel.

Figure 4:
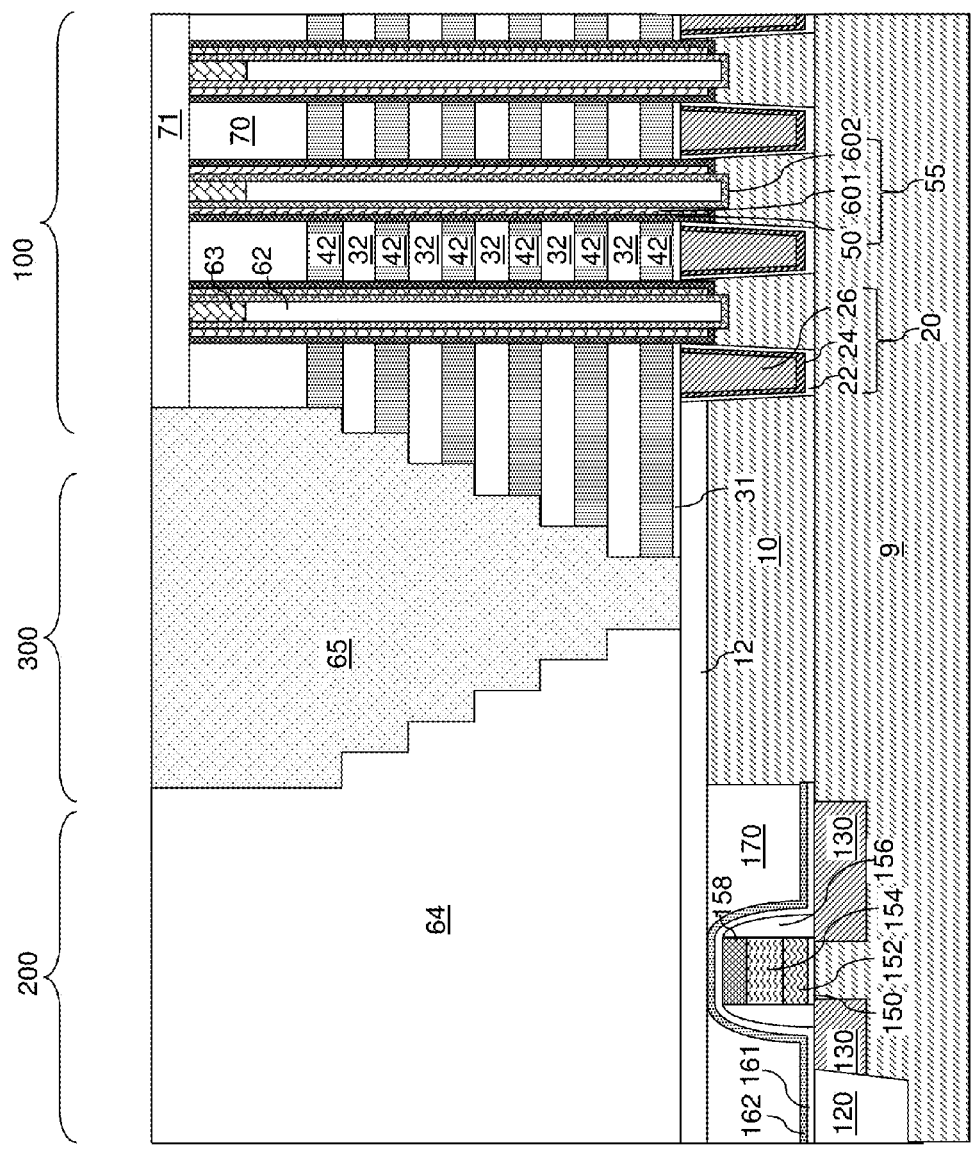
FIG. 4 is a vertical cross-sectional view of the exemplary structure after formation of a stepped terrace and a retro-stepped dielectric material portion according to an embodiment of the present disclosure.

Referring to FIG. 4, at least one dielectric cap layer 71 can be optionally formed over the planarization dielectric layer 70. Optionally, a portion of the alternating stack (32, 42) can be removed, for example, by applying and patterning a photoresist layer with an opening and by transferring the pattern of the opening through the alternating stack (32, 42) employing an etch such as an anisotropic etch. An optional trench extending through the entire thickness of the alternating stack (32, 42) can be formed within an area that includes a peripheral device region 200 and a portion of a contact region 300, which is adjacent to a device region 100 that includes an array of memory stack structures 55. Subsequently, the trench can be filled with an optional dielectric material such as silicon oxide. Excess portions of the dielectric material can be removed from above the top surface of the at least one dielectric cap layer 71 by a planarization process such as chemical mechanical planarization and/or a recess etch. The top surfaces of the at least one dielectric cap layer 71 can be employed as a stopping surface during the planarization. The remaining dielectric material in the trench constitutes a dielectric material portion 64.

A stepped cavity can be formed within the contact region 300, which can straddle the dielectric material portion 64 and a portion of the alternating stack (32, 42). Alternatively, the dielectric material portion 64 may be omitted and the stepped cavity 69 may be formed directly in the stack (32, 42). The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

The dielectric material portion 64 can have stepped surfaces after formation of the stepped cavity, and a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the at least one dielectric cap layer 71, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 5A:
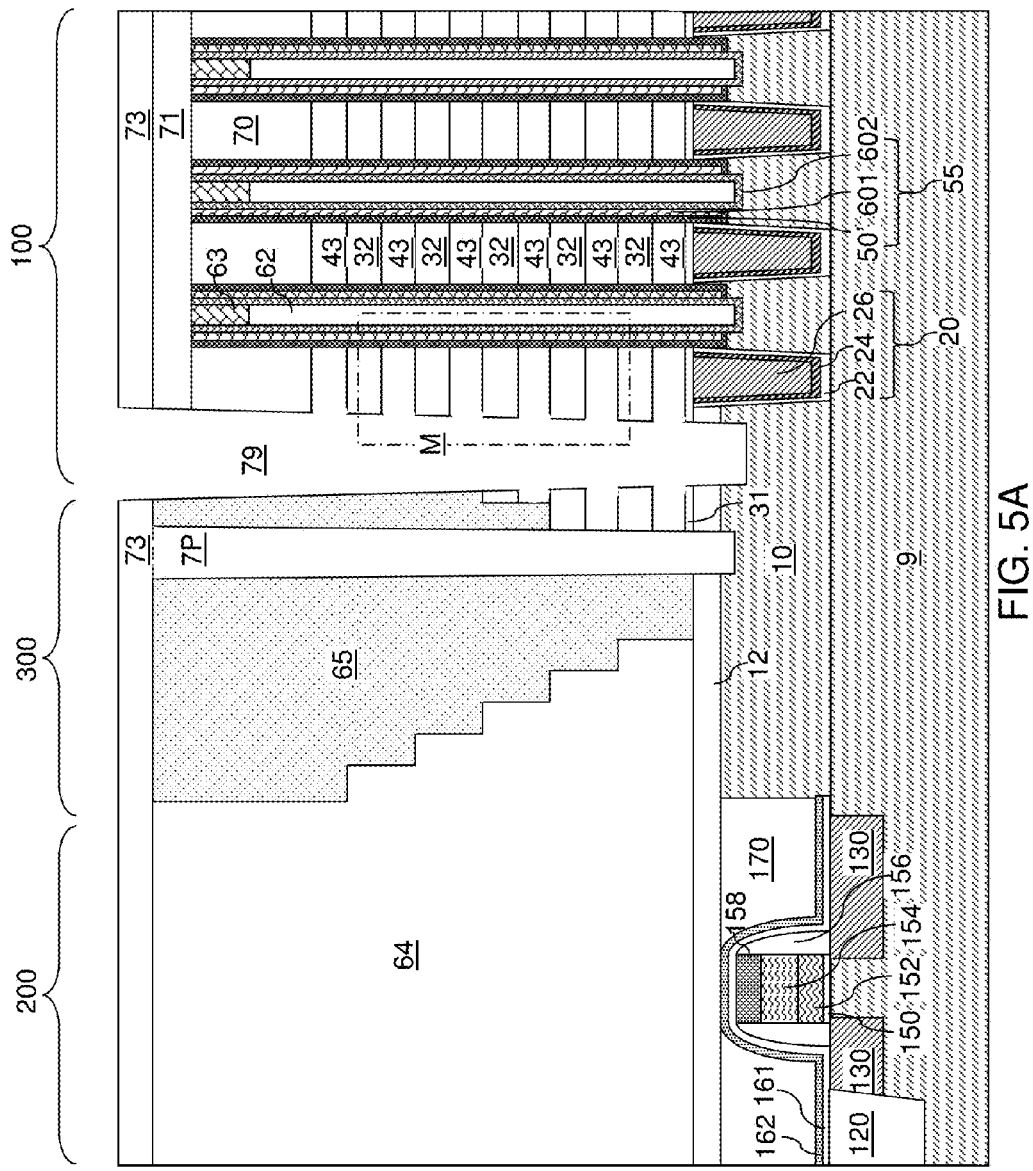
FIG. 5A is a vertical cross-sectional view of the exemplary structure after formation of a backside via cavity and backside recesses according to an embodiment of the present disclosure.
Figure 5B:
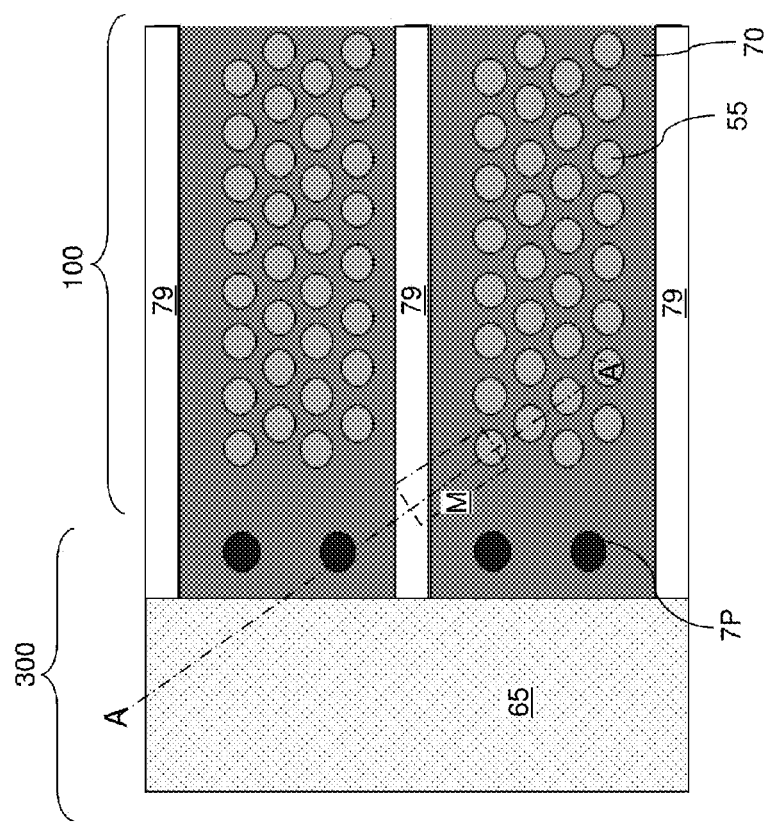
FIG. 5B is a see-through top-down view of the exemplary structure of FIG. 5A. The vertical plane A-A' is the plane of the vertical cross-sectional view of FIG. 5A.

Referring to FIGS. 5A and 5B, at least one dielectric support pillar 7P may be optionally formed through the retro-stepped dielectric material portion 65 and/or through the alternating stack (32, 42). The plane A-A' in FIG. 5B corresponds to the plane of the vertical cross-sectional view of FIG. 5A. In one embodiment, the at least one dielectric support pillar 7P can be formed in the contact region 300, which is located adjacent to the device region 100. The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the sacrificial material layers 42.

In one embodiment, the at least one dielectric support pillar can include silicon oxide and/or a dielectric metal oxide such as aluminum oxide. In one embodiment, the portion of the dielectric material that is deposited over the at least one dielectric cap layer 71 concurrently with deposition of the at least one dielectric support pillar 7P can be present over the at least one dielectric cap layer 71 as a dielectric pillar material layer 73. The dielectric pillar material layer 73 and the at least one dielectric support pillar 7P can be formed as a single contiguous structure of integral construction, i.e., without any material interface therebetween. In another embodiment, the portion of the dielectric material that is deposited over the at least one dielectric cap layer 71 concurrently with deposition of the at least one dielectric support pillar 7P can be removed, for example, by chemical mechanical planarization or a recess etch. In this case, the dielectric pillar material layer 73 is not present, and the top surface of the at least one dielectric cap layer 71 can be physically exposed.

A photoresist layer (not shown) can be applied over the alternating stack (32, 42) and/or the retro-stepped dielectric material portion 65, and optionally over the and lithographically patterned to form at least one backside contact trench 79 in an area in which formation of a backside contact via structure is desired. The pattern in the photoresist layer can be transferred through the alternating stack (32, 42) and/or the retro-stepped dielectric material portion 65 employing an anisotropic etch to form the at least one backside contact trench 79, which extends at least to the top surface of the substrate (9, 10). In one embodiment, the at least one backside contact trench 79 can include a source contact opening in which a source contact via structure can be subsequently formed. If desired, a source region (not shown) may be formed by implantation of dopant atoms into a portion of the semiconductor material layer 10 through the backside contact trench 79.

An etchant that selectively etches the second material of the sacrificial material layers 42 with respect to the first material of the insulator layers 32 can be introduced into the at least one backside contact trench 79, for example, employing an etch process. Backside recesses 43 are formed in volumes from which the sacrificial material layers 42 are removed. The removal of the second material of the sacrificial material layers 42 can be selective to the first material of the insulator layers 32, the material of the at least one dielectric support pillar 7P, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulator layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulator layers 32, the at least one dielectric support pillar 7P, and the retro-stepped dielectric material portion 65 can be selected from silicon oxide, silicon nitride, and dielectric metal oxides. In this case, the depth of the at least one backside contact trench 79 can be modified so that the bottommost surface of the at least one backside contact trench 79 is located within the dielectric pad layer 12, i.e., to avoid physical exposure of the top surface of the semiconductor substrate layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside contact trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side recesses or front side cavities in contrast with the backside recesses 43. In one embodiment, the device region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulator layer 32 and a bottom surface of an overlying insulator layer 32. In one embodiment, each backside recess 43 can have a uniform height throughout. Optionally, a backside blocking dielectric layer can be formed in the backside recesses.

Figure 6A:
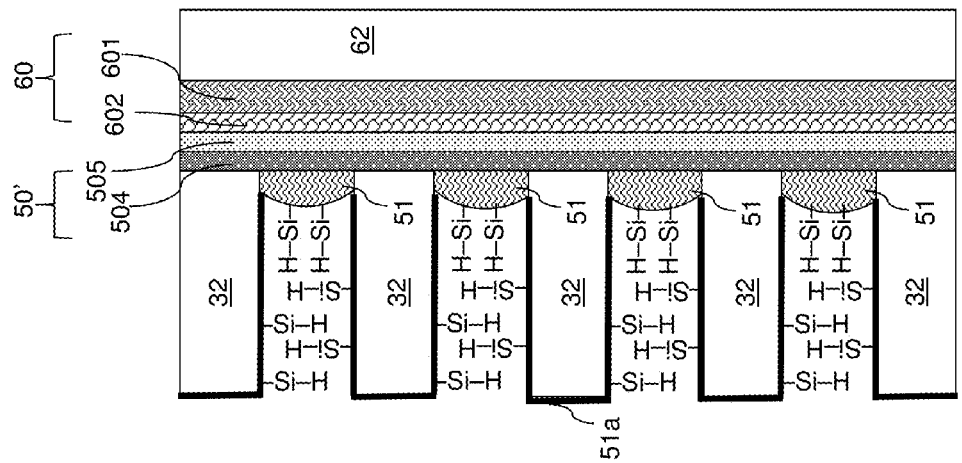

Referring to FIG. 6A, a magnified region M of FIGS. 5A and 5B is illustrated in a magnified view. After the second material layers (i.e., the sacrificial material layers 42) are removed selective to the first material layers (i.e., the insulator layers 32) and the memory film 50', an outer sidewall of the memory film 50' is physically exposed within each backside recess 43. Each insulator layer 32 is a dielectric material portion located over the substrate (9, 10). In one embodiment, each insulator layer 32 can include a dielectric oxide material having —OH terminated surfaces. For example, each insulator layer 32 can comprise a silicon oxide layer having —OH terminated surfaces. In one embodiment, the memory material layer 504 can include a nitrogen-containing material portion having an —NH terminated surface. For example, the memory material layer 504 can include a dielectric nitride material having an —NH terminated surface. In one embodiment, the memory material layer 504 can include silicon nitride, which has an —NH terminated surface. In one embodiment, within each backside recess 46, a pair of horizontal —OH terminated dielectric surfaces can be present on the dielectric material portions (as embodied in the insulator layers 32) and an —NH terminated surface can be present on a nitrogen-containing material portion (as embodied in the memory material layer 504). In one embodiment, the nitrogen-containing material portion having the —NH terminated surface can be a silicon nitride layer that constitutes the memory material layer 504.

As used herein, a radical terminated surface refers to a surface having a surface termination with the radical at a predominant portion (i.e., more than 50%) of the surface. For example, an —OH terminated surface has a surface termination with —OH radicals at a predominant portion thereof, and an —NH terminated surface has a surface termination with —NH radicals at a predominant portion thereof. In one embodiment, the —OH terminated surfaces of the insulator layers and the —NH terminated surfaces of the memory material layer 504 can be formed by employing an aqueous solution (such as phosphoric acid) or a hydride gas (such as HCl) as an etchant to remove the sacrificial material layers 42.

In an illustrative example, the insulator layers 32 can be silicon oxide layers and the memory material layer 504 can be a silicon nitride layer. A silicon oxide surface is normally terminated by —OH groups, and a silicon nitride surface is normally terminated with —$NH_x$ groups. A configuration in which a surface is terminated with —OH groups (i.e., —OH radicals) is herein referred to as —OH termination, and a configuration in which a surface is terminated with —$NH_x$ groups (i.e., —$NH_x$ radicals) is herein referred to as —NH termination.

In one embodiment, surface pretreatment (such as HF clean and isopropyl alcohol (IPA) drying) can be avoided on surfaces of silicon oxide and silicon nitride prior to exposure to semiconductor precursor gases such as $SiH_4$, $SiH_2Cl_2$, $SiHCl_3$, or $Si_2H$ (which is performed in the next processing step). In this case, the surfaces of silicon oxide and silicon nitride have different incubation times for deposition of a semiconductor material by decomposition of the semiconductor precursor gas. Specifically, the incubation time for deposition of the semiconductor material on silicon oxide is greater than the incubation time for deposition of the semiconductor material on silicon nitride. If the duration of the exposure to the semiconductor precursor gas is selected between the incubation time for deposition of the semiconductor material on silicon oxide and the incubation time for deposition of the semiconductor material on silicon nitride, the semiconductor material is deposited only on the surfaces of silicon nitride, and does not grow from the surfaces of silicon oxide.

Figure 6B:
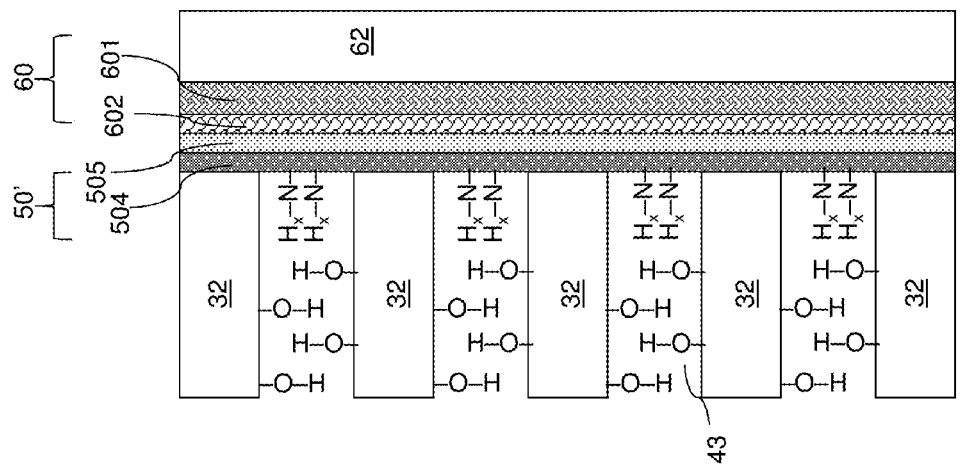

Referring to FIG. 6B, an in-process silicon-containing semiconductor portion 51 is formed on each physically exposed surface of the memory material layer 504 by a selective deposition process. Each in-process silicon-containing semiconductor portion 51 is an in-process structure, and as such, an in-process silicon-containing semiconductor portion. As used herein, an "in-process" structure refers to a structure that is present during a processing step of a manufacturing process, and may, or may not, be modified during subsequent processing steps. Each in-process silicon-containing semiconductor portion 51 will act as a seed region for selective growth of a silicon-containing floating gate in subsequent steps.

The in-process silicon-containing semiconductor portions 51 can be formed by placing the exemplary structure in a process chamber, and by flowing a semiconductor hydride precursor as a reactant gate for a deposition process that deposits the semiconductor material of the in-process silicon-containing semiconductor portions 51. In one embodiment, a semiconductor hydride precursor can be employed as a reactant gas for the deposition process and/or hydrogen can be employed as a carrier gas for the deposition process. In this case, an —SiH terminated semiconductor surface can be formed on each in-process silicon-containing semiconductor portion 51. In other words, the in-process silicon-containing semiconductor portions 51 can be formed by depositing a silicon-containing semiconductor material with —SiH termination.

In one embodiment, the semiconductor hydride precursor can comprise a silicon hydride precursor such as $SiH_4$, $SiH_2Cl_2$, $SiHCl_3$, $Si_2H_6$, a derivative including at least one hydrogen atom, and a combination thereof. Optionally, a carrier gas such as hydrogen or nitrogen can be employed. Alternatively, a non-hydride semiconductor precursor gas (such as $SiCl_4$) can be flowed with hydrogen carrier gas to provide hydrogen atoms to form the —SiH terminated surfaces. The in-process silicon-containing semiconductor portions 51 can include a silicon-containing semiconductor material such as silicon, a silicon-germanium alloy, a silicon-carbon alloy, a silicon-germanium-carbon alloy, silicon doped with p-type dopants or n-type dopants, or alloys thereof. If the in-process silicon-containing semiconductor portions 51 include a material other than silicon, at least one precursor gas for the material other than silicon can be employed. For example, $GeH_4$ and/or $C_2H_2$ can be employed to introduce germanium or carbon into the in-process silicon-containing semiconductor portions 51. In one embodiment, the in-process silicon-containing semiconductor portions 51 can include polysilicon or amorphous silicon.

The selective deposition process can be based on differences in the incubation time for deposition of a semiconductor material thereupon between —NH terminated surfaces and —OH terminated surfaces. Incubation time refers to the time that a surface needs to be exposed to a reactant gas before deposition of a material derived from decomposition of the reactant gas can commence. The incubation time for each surface corresponds to a nucleation time, which is the time necessary to nucleate islands of non-volatile atoms from the reactant gas. The incubation time is a function of the nature of the surface on which the nucleation proceeds, and can be a function of the reactant gas. In one embodiment, the silicon-containing semiconductor material derived from a silicon-containing precursor gas can be deposited on the —NH terminated surfaces (such as the surfaces of the memory material layer 504) at a greater nucleation rate than on the —OH terminated dielectric surfaces (such as the surfaces of the insulator layer 32).

In one embodiment, the —OH terminated dielectric surfaces (such as the surfaces of the insulator layers 32) can be converted into —SiH terminated dielectric surface after formation of the in-process silicon-containing semiconductor portions 51 on the —OH terminated dielectric surfaces (such as the surfaces of the insulator layer 32). In one embodiment, the —SiH terminated dielectric surfaces can be formed on each physically exposed surface of the first material layers (e.g., the insulator layers 32) concurrently with formation of the in-process silicon-containing semiconductor portions, i.e., the in-process silicon-containing semiconductor portions 51 formed on the memory material layer 504. In one embodiment, the insulator layers 32 can include silicon oxide, and the —OH radicals located on the surfaces of the insulator layers 32 can be replaced with —H radicals to provide —SiH termination to form the —SiH terminated dielectric surfaces.

The silicon-containing semiconductor portion 51 deposition on the silicon nitride surface may continue for a time less than the time required for nucleation onset and deposition on silicon oxide insulator layer 32 surfaces, such that substantially no semiconductor material 51 is deposited on the silicon oxide insulator layer 32 surfaces. Alternatively, the silicon-containing semiconductor portion 51 deposition on the silicon nitride surface may continue for a time greater than the time required for nucleation onset and deposition on silicon oxide insulator layer 32 surfaces, such that thin silicon-containing semiconductor layers 51a (e.g., amorphous silicon layers) are deposited on the silicon oxide insulator layer 32 surfaces. The semiconductor layers 51a are thinner than the silicon-containing semiconductor portion 51. In other words, the nucleation onset of the silicon-containing semiconductor material on the —NH terminated surface 504 occurs before the nucleation onset of the silicon-containing semiconductor material on the —OH terminated dielectric surface 32 to form the silicon-containing semiconductor material 51 on the —NH terminated surface with the greater thickness than on the —OH terminated dielectric surface.

Each in-process silicon-containing semiconductor portion 51 is an annular semiconductor structure, i.e., a ring-shaped semiconductor material structure. Each in-process silicon-containing semiconductor portion 51 is topologically homeomorphic to a torus. As used herein, an element is topologically homeomorphic to a shape is the element can be continuously stretched or shrunk into the shape without forming a new hole or removing a pre-existing hole on the surface of the element.

Figure 6C:
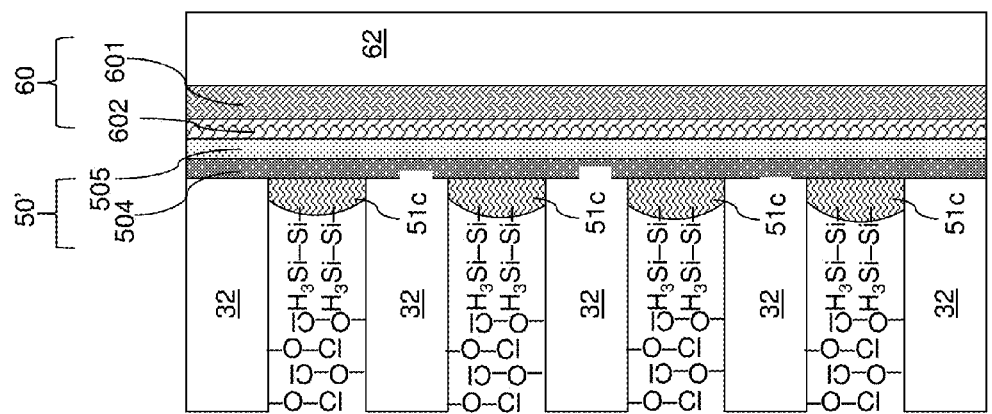

Referring to FIG. 6C, each in-process silicon-containing semiconductor portion 51 and the semiconductor layers 51a can be exposed to a chlorine-containing gas to etch away (remove) the semiconductor layers 51a to expose the silicon oxide insulator layer 32 surfaces and to decrease the thickness of the silicon-containing semiconductor portion 51. Since the silicon-containing semiconductor portion 51 and the semiconductor layers 51a are etched at the same rate and the silicon-containing semiconductor portion 51 is thicker than the semiconductor layers 51a, the semiconductor layers 51a are completed removed, while the silicon-containing semiconductor portion 51 remains with a decreased thickness after the etching step. Each remaining portion of the in-process silicon-containing semiconductor portion 51 after exposure to the chlorine-containing gas constitutes a silicon-containing semiconductor portion 51b having a respective —SiCl terminated semiconductor surface. The chlorine-containing gas can be an etchant gas such as hydrogen chloride (HCl) or in an alternative embodiment it can be a reactant gas including silicon, chlorine, and optionally hydrogen (such as $SiH_2Cl_2$, $SiHCl_3$, and $SiCl_4$). Each in-process silicon-containing semiconductor portion 51 at the processing step of FIG. 6B can be an antecedent in-process silicon-containing semiconductor portion 51 for the corresponding in-process silicon-containing semiconductor portion 51b after the processing step of FIG. 6C.

The in-process silicon-containing semiconductor portion 51b including a silicon-containing semiconductor material and having an —SiCl terminated semiconductor surface can be formed on the memory film 50 within each backside recess 43, while —OCl terminated dielectric surfaces are formed on the dielectric material portions of the insulator layers 32. Thus, —OCl terminated insulator surfaces can be formed on the first material layers (i.e., the insulator layers 32 that can include silicon oxide) concurrently with formation of the —SiCl terminated semiconductor surfaces on the in-process silicon-containing semiconductor portions 51b.

In the above embodiment, the in-process silicon-containing semiconductor portions 51b having the —SiCl terminated semiconductor surfaces can be formed during an etch back process that follows the selective deposition process. During the etchback process, an etchant gas, such as HCl, can be flowed into the process chamber to change —SiH terminated semiconductor surfaces of the silicon-containing semiconductor portions 51 to —SiCl terminated semiconductor surfaces 51b and to remove the semiconductor layers 51a.

In an alternatively embodiment, the in-process silicon-containing semiconductor portions 51 having the —SiCl terminated semiconductor surfaces can be formed during the selective deposition process by a chlorine-containing reactant gas such as $SiH_2Cl_2$, $SiHCl_3$, and $SiCl_4$. In one aspect of the alternative embodiment, the composition of the reactant gas may be changed during a deposition process to induce the —SiCl terminated semiconductor surfaces employing a chlorine-containing reactant gas. For example, the composition of the reactant gas can be changed during the selective deposition process in change the surfaces of the in-process silicon-containing semiconductor portions 51 from —SiH terminated surfaces to chlorine terminated surfaces.

If the insulator layers 32 include silicon oxide, the hydroxide radicals attached to the silicon atoms at the surfaces of the insulator layers 32 are replaced with —Cl radicals to provide —OCl terminated dielectric surfaces, which can be chlorine terminated silicon oxide surfaces. The —OCl terminated dielectric surfaces can be formed on the dielectric material portions (i.e., the insulator layers 32) during exposure of the in-process silicon-containing semiconductor portions 51 to the chlorine-containing gas. In one embodiment, the —OCl terminated dielectric surfaces can be formed during etchback of the in-process silicon-containing semiconductor portions 51 and semiconductor layers 51a with a chlorine-containing etchant gas, such as HCl. Thus, physically exposed surfaces of the dielectric material portions (such as the insulator layers 32) are converted into the —OCl terminated dielectric surfaces.

The chlorine termination of the various surfaces prevents further deposition of additional semiconductor material as long as the chlorine termination is present on the surfaces. The chlorine termination can be maintained if the temperature of the exemplary structure is maintained below 400 degrees Celsius and the exemplary structure is not exposed to an environment that substitutes the —Cl radicals with different radicals. As such, the —SiCl terminated semiconductor surfaces are silicon deposition inhibiting surfaces located over the memory film 50, and the —OCl terminated dielectric surfaces are additional silicon deposition inhibiting surfaces located on the first material layers, i.e., the insulator layers 32.

Figure 6D:
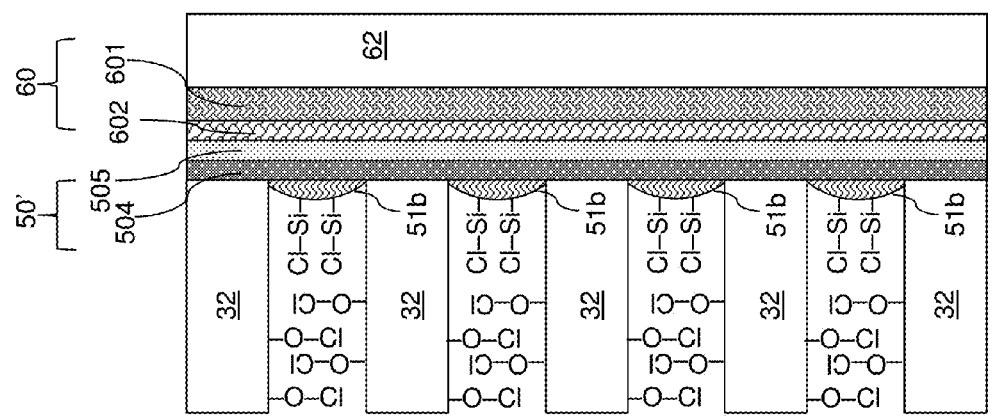

Referring to FIG. 6D, each —SiCl terminated semiconductor surface can be exposed to an aminosilane gas by placing the exemplary structure within a process chamber, or keeping the exemplary structure within the same process chamber in which the in-process silicon-containing semiconductor portions 51 are formed, and by flowing the aminosilane gas into the process chamber. Each —SiCl terminated semiconductor surface can be converted into an —SiSiH$_3$ terminated semiconductor surface, while the —OCl terminated dielectric surfaces remain without substitution of atoms. Thus, the —SiCl terminated semiconductor surfaces are converted to —SiSiH$_3$ terminated semiconductor surfaces on the in-process silicon-containing semiconductor portions 51c, while the insulator layer 32 surfaces remain —OCl terminated.

In one embodiment, the aminosilane gas can be selected from univalent aminosilane gases. Non-limiting examples of the univalent aminosilane gas include SiH$_3$(NHC(CH$_3$)$_3$), SiH$_3$(N(CH$_3$)$_2$, bistertialbutylaminosilane (BTBAS), butylaminosilane (BAS), bisdimethylaminodimethylsilane (BDMAS), trisdimethylaminosilane (TDMAS), diethylaminosilane (DEAS), bisdiethylaminosilane (BDEAS), dipropylaminosilane (DPAS), and diisopropylaminosilane (DIPAS). The presence of oxygen atoms in the insulator layers 32 including silicon oxide prevents or retards replacement of the —Cl radicals in the —OCl terminated dielectric surfaces with —SiH$_3$ radicals, while the absence of oxygen atoms in the in-process silicon-containing semiconductor portions 51 enables replacement of the —Cl radicals in the —SiCl terminated semiconductor surfaces of the in-process silicon-containing semiconductor portions 51c with the —SiH$_3$ radicals. Thus, the —SiH$_3$ radical of the univalent aminosilane gas is attached to the Si atoms of the in-process silicon-containing semiconductor portions 51c after removing the —Cl radicals from the in-process silicon-containing semiconductor portions 51c, while the —SiH$_3$ radical of the univalent aminosilane gas does not replace the —Cl radicals of the insulator layers 32. The —OCl terminated surfaces of the first material layers (i.e., the insulator layers 32) are silicon deposition inhibiting surfaces located on the first material layers, and the surfaces of the —SiSiH$_3$ terminated surfaces of the in-process silicon-containing semiconductor portions 51c are silicon deposition promoting surfaces located over the memory film in the back side recesses 43.

As used herein, a silicon deposition inhibiting surface is a surface that suppresses deposition of silicon thereupon by having a silicon nucleation time that is at least as long as the silicon nucleation time an —OH terminated silicon oxide surface. As used herein, a silicon deposition promoting surface is a surface that promotes deposition of silicon thereupon by having zero silicon nucleation time, or a nucleation time that is not greater than the silicon nucleation time of a hydrogen terminated silicon surface. As used herein, a silicon nucleation time refers to the intercept with the time axis in a graph representing a deposited film thickness as a function of exposure time to a silicon-containing reactant gas such as silane. Thus, in one embodiment, the silicon deposition inhibiting surfaces comprise —OCl terminated insulator surfaces, and the silicon deposition promoting surfaces comprise —SiSiH$_3$ terminated semiconductor surfaces.

In order to induce selective replacement of the —Cl radicals with —SiH$_3$ radicals at the chlorine terminated semiconductor conductor surfaces while preventing replacement of the —Cl radicals with —SiH$_3$ radicals at the —OCl terminated dielectric surfaces, the temperature of exemplary structure during exposure to the aminosilane gas can be in a range from 0 degrees Celsius to 400 degrees Celsius (such as 300 to 375, for example 325 to 350 degrees Celsius), although lesser and greater temperatures can also be employed. The partial pressure of the aminosilane gas during the replacement of the —Cl radicals with the —SiH$_3$ radicals at the surfaces of the in-process silicon-containing semiconductor portions 51 can be in a range from 0.01 mTorr to 1 atmospheric pressure, although lesser and greater pressures can also be employed. The duration of the exposure to the aminosilane gas can be selected so that a predominant portion of the surfaces of the in-process silicon-containing semiconductor portions 51c has —SiSiH$_3$ termination. In one embodiment, more than 90% of the surfaces of the in-process silicon-containing semiconductor portions 51c can have —SiSiH$_3$ termination. Thus, the —SiCl terminated semiconductor surfaces can be exposed to an aminosilane gas to convert the —SiCl terminated semiconductor surface to the —SiSiH$_3$ terminated semiconductor surfaces.

Subsequently, additional silicon-containing semiconductor material can be selectively grown on the —SiSiH$_3$ terminated semiconductor surface, while the additional silicon-containing semiconductor material is not deposited on the —OCl terminated dielectric surface. Referring to FIG. 6E, an additional silicon-containing semiconductor material can be deposited on each in-process silicon-containing semiconductor portion 51c to grow silicon-containing semiconductor portions 52. The silicon-containing semiconductor portions 52 are selectively grown laterally from the —SiSiH$_3$ terminated surfaces of the in-process silicon-containing semiconductor portions 51c of FIG. 6D within each backside recess 43. The additional silicon-containing semiconductor material can be deposited on the —SiSiH$_3$ terminated semiconductor surface, while the additional silicon-containing semiconductor material is not deposited on the —OCl terminated dielectric surface, i.e., on the surfaces of the insulator layer 32 that can include silicon oxide. The silicon-containing semiconductor material can be amorphous silicon, polycrystalline silicon, a silicon-germanium alloy, a silicon-carbon alloy, a silicon-germanium-carbon alloy, or a combination thereof. Thus, the additional silicon-containing semiconductor material grows from the —SiSiH₃ terminated semiconductor surfaces, and does not grow from the —OCl terminated insulator surfaces.

In one embodiment, the temperature of the deposition process that deposits the additional silicon-containing semiconductor material can be selected so that the chlorine termination of the dielectric surfaces of the insulator layers is maintained during the deposition of the additional silicon-containing semiconductor material. In one embodiment, the deposition of the additional silicon-containing semiconductor material can be performed at a temperature less than 400 degrees Celsius, such as 300 to 375, for example 325 to 350 degrees Celsius.

Each silicon-containing semiconductor portion 52 is an annular semiconductor structure, i.e., an annular silicon-containing semiconductor portion. Each silicon-containing semiconductor portion 52 is topologically homeomorphic to a torus. The lateral distance between an inner sidewall and the outer sidewall of each silicon-containing semiconductor portion 52 can be uniform or non-uniform throughout each silicon-containing semiconductor portion 52, and can be in a range from 3 nm to 30 nm, although lesser and greater lateral distances can also be employed. For example, the silicon-containing semiconductor portion 52 can have a non-uniform thickness with a thicker middle portion than top and bottom portions due to a convex curved (i.e., bowed out) outer surface.

While the selective termination of silicon oxide surfaces compared to silicon nitride surfaces to enhance selective silicon growth on the silicon nitride surface is described above with respect to a three dimensional NAND device floating gates, it should be understood that this selective silicon growth enhancement method can be applied to any other device in which selective silicon growth on silicon nitride compared to silicon oxide is desired.

Thus, generally, a nitrogen-containing material portion having a —NH terminated surface (such as the outer sidewall of the memory material layer 504 comprising silicon nitride) and the dielectric material portion having the —OH terminated dielectric surface (such as the silicon oxide surface of the insulator layers 32) can be formed over the substrate. A silicon-containing semiconductor material can be formed on the —NH terminated surface with a greater thickness than on the —OH terminated dielectric surface. In one embodiment, the silicon-containing semiconductor material can be formed by chemical vapor deposition employing a silicon hydride precursor as a reactant gas to deposit the silicon-containing semiconductor material with the —SiH termination. In one embodiment, a nucleation onset of the silicon-containing semiconductor material on the —NH terminated surface occurs before the nucleation onset of the silicon-containing semiconductor material on the —OH terminated dielectric surface to form the silicon-containing semiconductor material on the —NH terminated surface with the greater thickness than on the —OH terminated dielectric surface.

In one embodiment, the nitrogen-containing material portion having the —NH terminated surface can be a silicon nitride layer, the dielectric material portion can be a silicon oxide layer, and the silicon-containing semiconductor portion can be an amorphous silicon portion.

The silicon-containing semiconductor material can be etched using the chlorine-containing gas to leave the —SiCl terminated silicon-containing semiconductor portion on the —NH terminated surface, to expose the dielectric surface of the dielectric material portion, and to convert the —OH terminated dielectric surface to the —OCl terminated dielectric surface.

Generally, a combination of a —SiCl terminated surface and an —OCl terminated dielectric surface can be formed on any desired structure employing the methods of the present disclosure. In one embodiment, surfaces of the —OH terminated silicon oxide material layers (such as the insulator layers 32) can be converted into —OCl terminated insulator surfaces and the —SiH terminated surface of semiconductor material can be converted to a —SiCl terminated semiconductor surface upon exposure to the chlorine-containing gas.

Generally, the antecedent in-process silicon-containing semiconductor portions can be exposed to a chlorine-containing gas during a deposition process employing a chlorine-containing silicon precursor (such as dichlorosilane) or during an etch process employing HCl. Specifically, each silicon-containing semiconductor portion having the —SiH terminated surface semiconductor surface and each dielectric material portion having an —OH terminated dielectric surface can be exposed to a chlorine-containing gas to convert each —SiH terminated semiconductor surface to a —SiCl terminated semiconductor surface and to convert each —OH terminated dielectric surface to an —OCl terminated dielectric surface. The in-process silicon-containing semiconductor portions having —SiCl terminated semiconductor surfaces can be thus formed. In one embodiment, in-process silicon-containing semiconductor portions having —SiCl terminated semiconductor surfaces can be formed on the physically exposed outer sidewalls of the memory film 50 within the backside recesses 43.

The —SiCl terminated semiconductor surface and the —OCl terminated dielectric surface can then be exposed to an aminosilane gas to convert the —SiCl terminated semiconductor surface to an —SiSiH₃ terminated semiconductor surface while the dielectric surface remains —OCl terminated. A silicon contain layer, such as amorphous silicon or polysilicon can be selectively grown on the —SiSiH₃ terminated semiconductor surface without growing from the —OCl terminated dielectric surface.

Referring to FIG. 6F, an outer portion of each silicon-containing semiconductor portion 52 can be converted into a dielectric material portion 53. The remaining portion of each silicon-containing semiconductor portion 52 constitutes a floating gate electrode for the three-dimensional memory structure. The set of silicon-containing semiconductor portions 52 constitutes a plurality of vertically spaced semiconductor floating gate electrodes. Each floating gate electrode has a vertical inner sidewall and a curved outer sidewall. In one embodiment, the curved outer sidewalls of the floating gate electrodes can be convex surfaces. In one embodiment, each floating gate is thicker at its middle portion than in its upper and lower end portions. In one embodiment, each floating gate electrode can be thicker in its middle portion than in its upper and lower end portions.

Each dielectric material portion 53 functions as a blocking dielectric that prevents leakage of electrical charges from a floating gate. The conversion of the outer portions of the silicon-containing semiconductor portions 52 into the dielectric material portions 53 can be performed employing at least one process selected from thermal oxidation, thermal nitridation, plasma oxidation, plasma nitridation, and a combination thereof. The dielectric material portions 53 can include an oxide, a nitride, or an oxynitride of the semiconductor material of the silicon-containing semiconductor portion 52. The set of dielectric material portions 53 constitutes a plurality of vertically spaced blocking dielectrics. Each blocking dielectric can have a curved inner sidewall and a curved outer sidewall. In one embodiment, each blocking dielectric can have a concave inner sidewall and a convex outer sidewall. In one embodiment, each blocking dielectric can have a substantially same thickness throughout.

Each dielectric material portion 53 is an annular dielectric structure, i.e., an annular blocking dielectric material portion. Each dielectric material portion 53 is topologically homeomorphic to a torus. The lateral distance between an inner sidewall and the outer sidewall of each dielectric material portion 53 can be uniform throughout each dielectric material portion 53, and can be in a range from 1.5 nm to 15 nm, although lesser and greater lateral distances can also be employed. Each dielectric material portion 53 laterally surrounds, and contacts outer sidewalls of, a silicon-containing semiconductor portion 52 (e.g., the floating gate). Each adjoining pair of a dielectric material portion 53 and a silicon-containing semiconductor portion 52 can have the same height. Each dielectric material portion 53 can function as a blocking dielectric for the memory stack structures (50', 60).

In one embodiment, each floating gate electrode cam comprise a silicon floating gate electrode that has an annular shape, and an outer surface of each floating gate electrode facing a blocking dielectric 53 has a larger curvature than an inner surface facing the memory film 50. The curvature of the inner surface can be zero (i.e., have a curvature of radius of infinity). In one embodiment, each blocking dielectric (embodied as a dielectric material portion 53) can have an annular shape and can surround a respective floating gate electrode (embodied as a silicon-containing semiconductor portion 52). Each blocking dielectric can comprise silicon oxide or silicon nitride. Outer and inners surfaces of the each blocking dielectric can be curved.

Figure 6G:
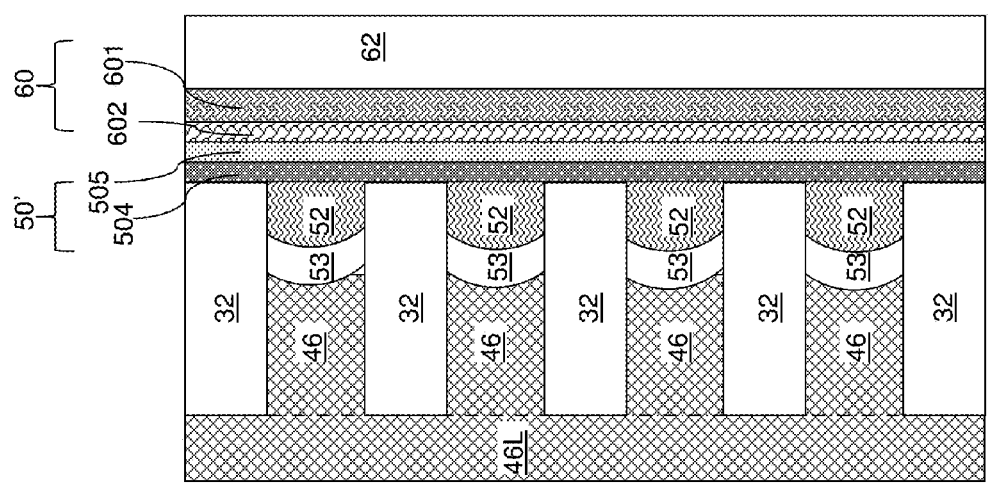
Figure 8:
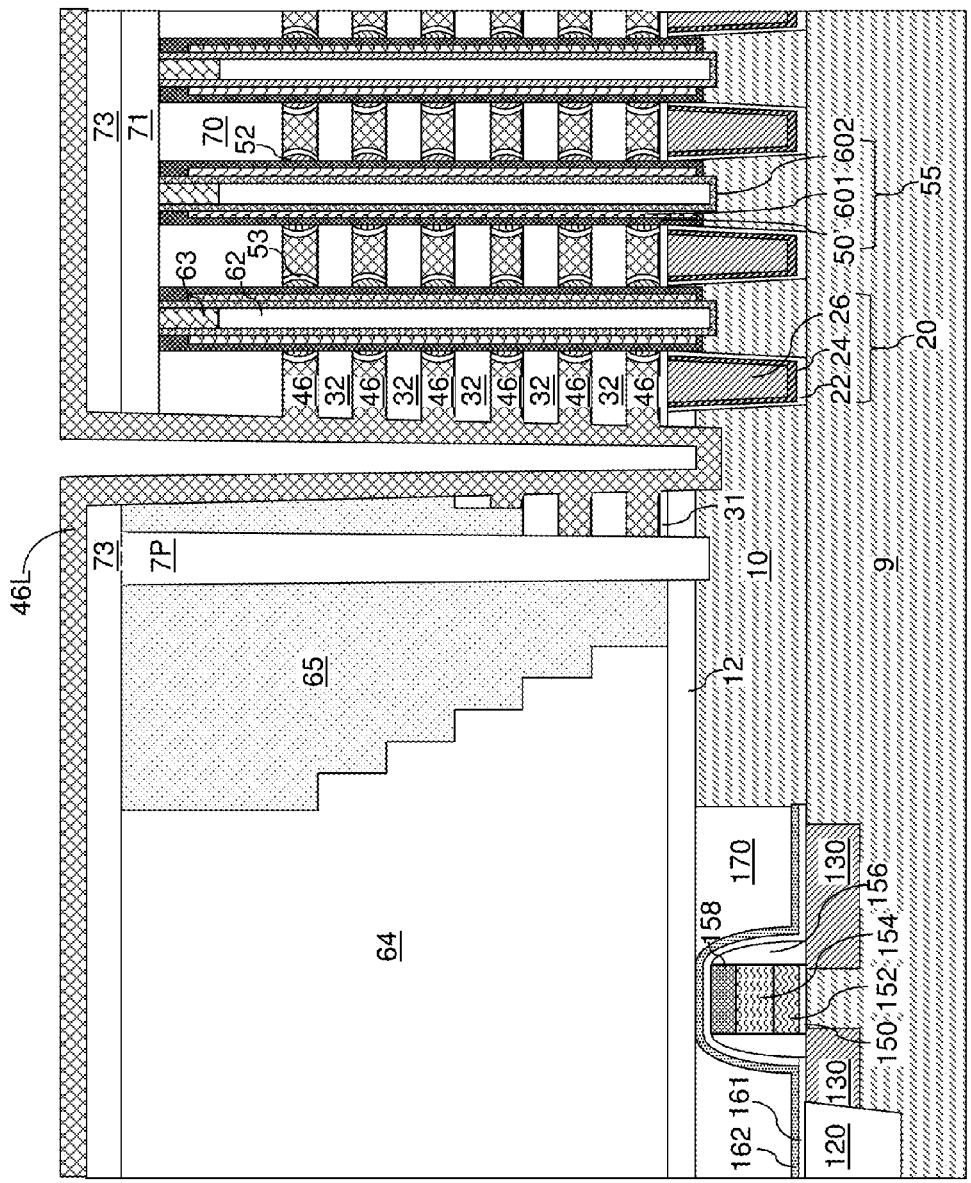
FIG. 8 is a vertical cross-sectional view of the exemplary structure after formation of the electrically conductive lines according to an embodiment of the present disclosure.

Referring to FIGS. 6G and 8, a conductive material can be deposited in the plurality of backside recesses 43, on sidewalls of the at least one the backside contact trench 79, and over the top surface of the dielectric pillar material layer 73 (or the topmost layer of the exemplary structure in case the dielectric pillar material layer 73 is not employed). As used herein, a conductive material refers to an electrically conductive material. The conductive material can be deposited by a conformal deposition method, which can be, for example, chemical vapor deposition (CVD), atomic layer deposition (ALD), electroless plating, electroplating, or a combination thereof. The conductive material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary conductive materials that can be deposited in the plurality of backside recesses 43 include tungsten, tungsten nitride, titanium, titanium nitride, tantalum, and tantalum nitride. In one embodiment, the conductive material can comprise a metal such as tungsten and/or metal nitride. In one embodiment, the conductive material for filling the plurality of backside recesses 43 can be selected from tungsten and a combination of titanium nitride and tungsten. In one embodiment, the conductive material can be deposited by chemical vapor deposition.

A plurality of electrically conductive layers 46 can be formed in the plurality of backside recesses 43, and a contiguous conductive material layer 46L can be formed on the sidewalls of each backside contact trench 79 and over the dielectric pillar material layer 73 (or the topmost layer of the exemplary structure in case the dielectric pillar material layer 73 is not employed). Thus, at least a portion of each sacrificial material layer 42 can be replaced with an electrically conductive layer 46, which is a conductive material portion.

Figure 7B:
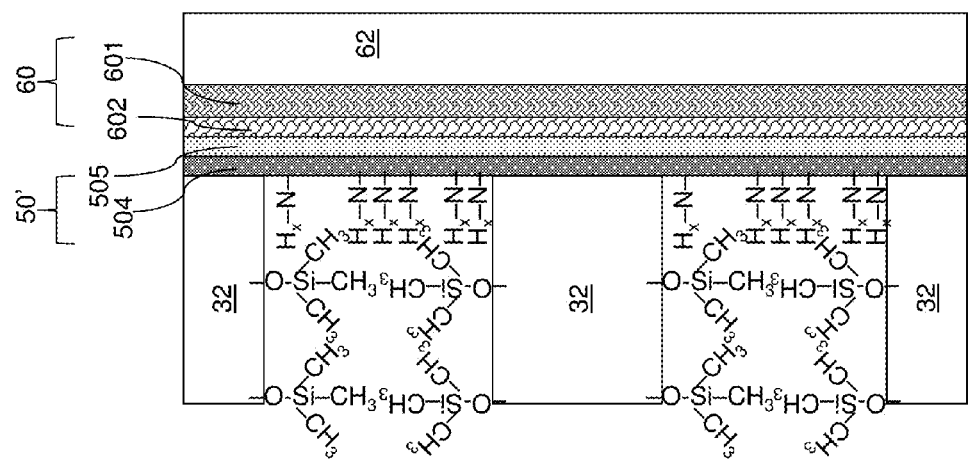
FIGS. 7A and 7B are sequential vertical cross-sectional view of an alternate embodiment of the exemplary structure during formation of silicon-containing semiconductor portions according to a second embodiment of the present disclosure.
Figure 7A:
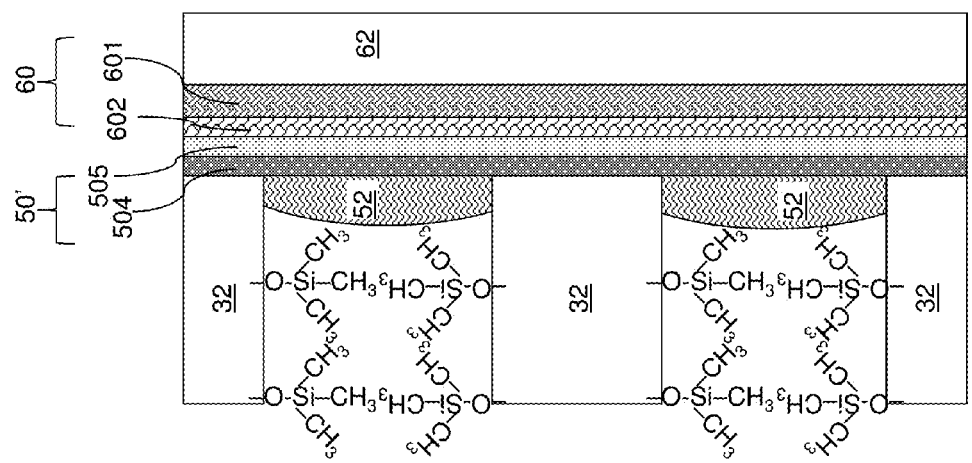

Referring to FIG. 7A, an alternate embodiment of the exemplary structure can be derived from the exemplary structure of FIG. 6A by performing a silylation treatment process. In one embodiment, the silylation treatment process can be preceded by a HF treatment, which can be a wet preclean or a vapor phase preclean. In this case, the physically exposed outer surfaces of the memory film 50 and surfaces of the first material layers, i.e., the insulator layers 32, can be cleaned with hydrofluoric acid. The silylation treatment process replaces the —OH radicals on the surfaces of the dielectric oxide material (such as the silicon oxide material of the insulator layers 32) with —OSi(CH$_3$)$_3$ radicals, while a predominant portion of the —NH$_x$ radicals remain intact on the sidewalls of the memory material layer 504 (which can be, for example, a silicon nitride layer).

For the silylation treatment process, a solution including a silylation agent can be employed. Non-limiting examples of silylation agents include hexamethyldisilazane; N-(trimethylsilyl)dimethylamine (TMSDMA, also known as N,N-Dimethyltrimethylsilylamine); trimethylsilylimidazole (TMSI); N,O-bis(trimethylsilyl)trifluoroacetamide (BSTFA); N,O-bis(trimethylsilyl)acetamide (BSA); N-methyl-N-(trimethylsilyl)trifluoroacetamide (MSTFA); N,N-diethyl-1,1,1-trimethylsilylamine (TMSDEA); N-methyl-N-trimethylsilyl-acetamide (MTMSA); and chlorotrimethylsilane(TMCS). Silylation is a reaction in which a hydrogen atom in an —OH group is replaced with a trimethylsilyl group (—Si(CH$_3$)$_3$ to provide an —OSi(CH$_3$)$_3$ group. Therefore, as the silylation treatment process progresses, a surface state changes on silicon oxide surfaces where a predominant portion of, or an entirety of, the —OH groups is converted into —OSi(CH$_3$)$_3$ groups. However, silylation process does not proceed on the silicon nitride surfaces. Thus, the surface state of the memory material layer 504 does not change significantly during the silylation treatment process. An illustrative example of a silylation reaction can be:

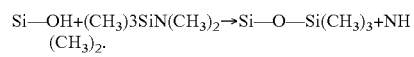

Si—OH+(CH$_3$)$_3$SiN(CH$_3$)$_2$→Si—O—Si(CH$_3$)$_3$+NH(CH$_3$)$_2$.

Subsequently, isopropyl alcohol (IPA) dry process can be employed, in which vapor of isopropyl alcohol is employed to remove any residual solution including the silylation agent. In this case, surfaces can be dried with isopropyl alcohol after exposure to the silylation agent. The —OSi(CH$_3$)$_3$ terminated surfaces of the first material layers (i.e., the insulator layers 32) are silicon deposition inhibiting surfaces located on the first material layers, and the surfaces of the —NH$_x$ terminated (hydrogen terminated) surfaces of the memory material layer 504 are silicon deposition promoting surfaces located over the memory film 50 in the back side recesses 43. By the end of the processing step of FIG. 7A, the —NH terminated surfaces and the —OH terminated insulator surfaces are exposed to a silylation agent containing an —Si(CH$_3$)$_3$ group to convert the —OH terminated insulator surfaces to —OSi(CH$_3$)$_3$ terminated insulator surfaces while the —NH terminated surfaces maintain —NH termination.

Alternatively, after —OH terminated insulator surfaces (such as —OH terminated silicon oxide surface) and —NH terminated surfaces (such as the —NH$_x$ terminated surfaces of the memory material layer 504) are prepared by a combination of a HF preclean process and an isopropyl alcohol (IPA) dry process, the silylation process can be performed in a gas phase, i.e., by supplying a silylation agent gas into a process chamber in which the exemplary structure is placed. In an illustrative example, the process chamber can be a chemical vapor deposition chamber in which a subsequent semiconductor (e.g., silicon portion 51 or 52) deposition process can be performed. The silylation agent that can be employed in a solution as discussed above may be introduced into the process chamber in a gas phase to perform a silylation process, in which the —OH groups are replaced with a respective trimethylsilyl group —(CH3)$_3$Si, while the —NH groups remain unaffected.

Referring to FIG. 7B, the processing step of FIG. 6B or 6E can be performed to form in-process silicon-containing semiconductor portions 51 or the silicon-containing semiconductor portions 52 of FIGS. 6B and 6E, respectively. These semiconductor portions 51 or 52 will be referred to as floating gates 52 below for brevity. Specifically, the exemplary structure can be placed in a process chamber, and a semiconductor hydride precursor can be flowed into the process chamber as a reactant gate for a deposition process that deposits the semiconductor material of the in-process silicon-containing semiconductor portions 51 of FIG. 6B or the silicon-containing semiconductor portions 52 of FIG. 6E. In one embodiment, a semiconductor hydride precursor can be employed as a reactant gas for the deposition process and/or hydrogen can be employed as a carrier gas for the deposition process. The floating gates 52 are selectively grown laterally from the —NH$_x$ terminated surfaces of the memory material layer 504 within each backside recess 43. In one embodiment, if the silylation process is performed in a gas phase, the deposition of the semiconductor material can proceed in the same chamber. In this case, the silylation agent is applied to an —NH terminated first dielectric surface and an —OH terminated second dielectric surface in a gas phase in a process chamber, and the silicon-containing semiconductor material is selectively grown in the same process chamber.

In one embodiment, the semiconductor hydride precursor can comprise a silicon hydride precursor such as SiH$_4$, SiH$_2$Cl$_2$, SiHCl$_3$, Si$_2$H$_6$, a derivative including at least one hydrogen atom, and a combination thereof. Optionally, a carrier gas such as hydrogen or nitrogen can be employed. Alternatively, a non-hydride semiconductor precursor gas (such as SiCl$_4$) can be flowed with hydrogen carrier gas to provide hydrogen atoms to form the —SiH terminated surfaces. The floating gates 52 can include a silicon-containing semiconductor material such as silicon, a silicon-germanium alloy, a silicon-carbon alloy, a silicon-germanium-carbon alloy, silicon doped with p-type dopants or n-type dopants, or alloys thereof. If the floating gates 52 a material other than silicon, at least one precursor gas for the material other than silicon can be employed. For example, GeH$_4$ and/or C$_2$H$_2$ can be employed to introduce germanium or carbon into the floating gates 52. In one embodiment, the floating gates 52 can include polysilicon or amorphous silicon.

The silylation treatment process causes silicon oxide surfaces to be covered with trimethylsilyl group having a high molecular weight. The steric hindrance caused by the presence of the trimethylsilyl groups prevents the semiconductor hydride precursor from transferring silicon atoms to the surface of the insulator layers, thereby resulting in a prolonged incubation time. On the other hand, the incubation time for the silicon nitride surfaces is not affected because silylation does not occur on the silicon nitride surfaces. The difference in the incubation times between the silicon oxide surfaces and the silicon nitride surfaces increases due to silylation of the silicon oxide surfaces. During the processing steps of FIG. 7B, the floating gates 52 are selectively grown on the —NH terminated surfaces of the memory film within each backside recess, while the floating gates 52 do not grow from the —OSi(CH$_3$)$_3$ terminated insulator surfaces.

Figures 7C, 7D:
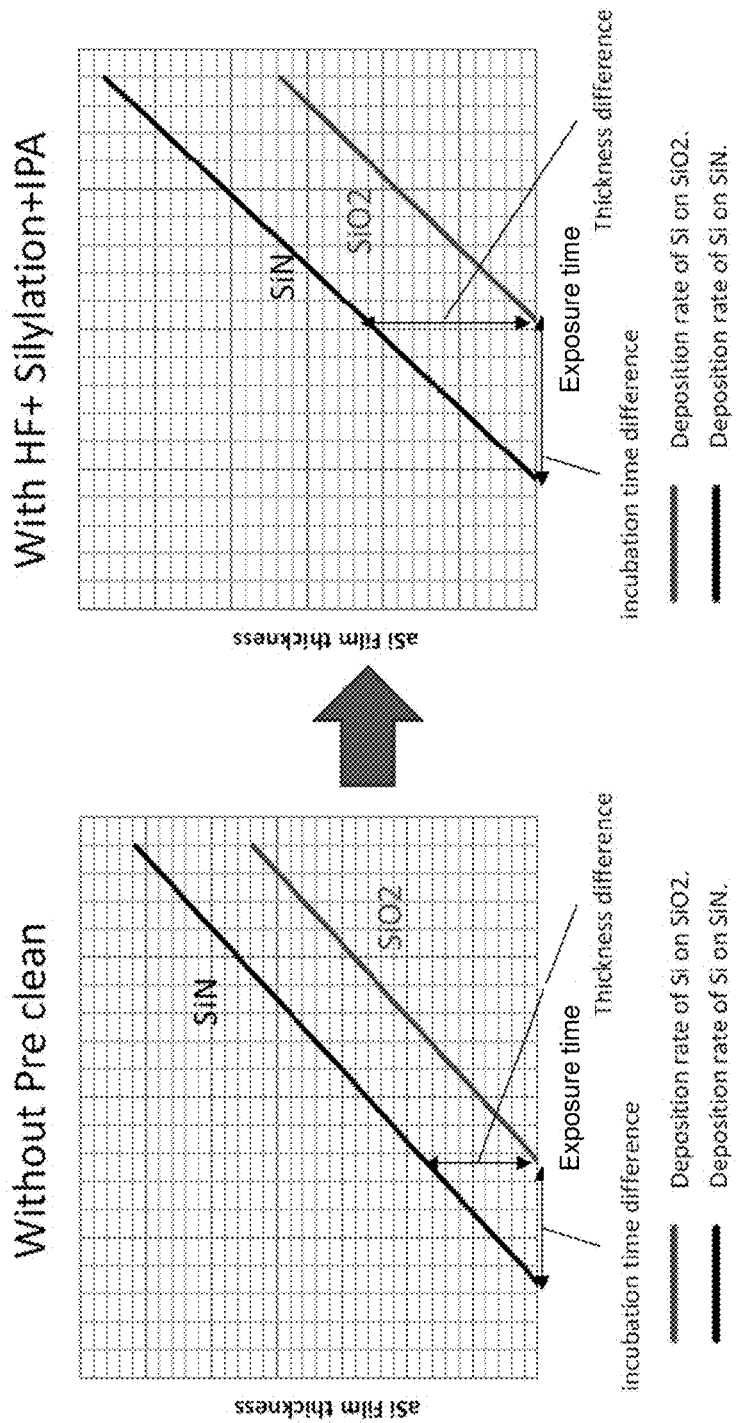
FIG. 7C illustrates plots of amorphous silicon film thickness versus incubation time without a silylation pre-clean and FIG. 7D illustrates plots of amorphous silicon film thickness versus incubation time with the silylation pre-clean.

FIGS. 7C and 7D show the difference in the incubation times of amorphous silicon on silicon nitride and silicon oxide surfaces when the oxide surfaces are not pre-cleaned (i.e., not silylated) in FIG. 7C and when the oxide surfaces are pre-cleaned (i.e., are silylated) in FIG. 7C. The difference in incubation time is increased after the pre-cleaning. Thus, a thicker amorphous silicon region may be grown on silicon nitride before the onset of nucleation of amorphous silicon begins on silicon oxide with the pre-clean step. The scales are arbitrary in the two graphs.

The selective deposition process can be based on differences in the incubation time for deposition of a semiconductor material thereupon between —NH terminated surfaces and —OSi(CH$_3$)$_3$ terminated surfaces. In one embodiment, the silicon-containing semiconductor material derived from a silicon-containing precursor gas can be deposited on the —NH terminated surfaces (such as the surfaces of the memory material layer 504) at a greater nucleation rate than on the —OSi(CH$_3$)$_3$ terminated dielectric surfaces (such as the surfaces of the insulator layer 32). By terminating the deposition process at a time after the incubation time for the —NH terminated surfaces and before the incubation time for the —OSi(CH$_3$)$_3$ terminated dielectric surfaces, the floating gates can grow only from the —NH terminated surfaces, and not grow from the —OSi(CH$_3$)$_3$ terminated dielectric surfaces.

While the selective silylation of silicon oxide surfaces compared to silicon nitride surfaces to enhance selective silicon growth on the silicon nitride surface is described above with respect to a three dimensional NAND device floating gates, it should be understood that this selective silicon growth enhancement method can be applied to any other device in which selective silicon growth on silicon nitride compared to silicon oxide is desired.

Subsequently, the processing steps of FIGS. 6F and 6G can be performed to form the exemplary structure containing the conductive material layer illustrated in FIG. 8.

Figure 9:
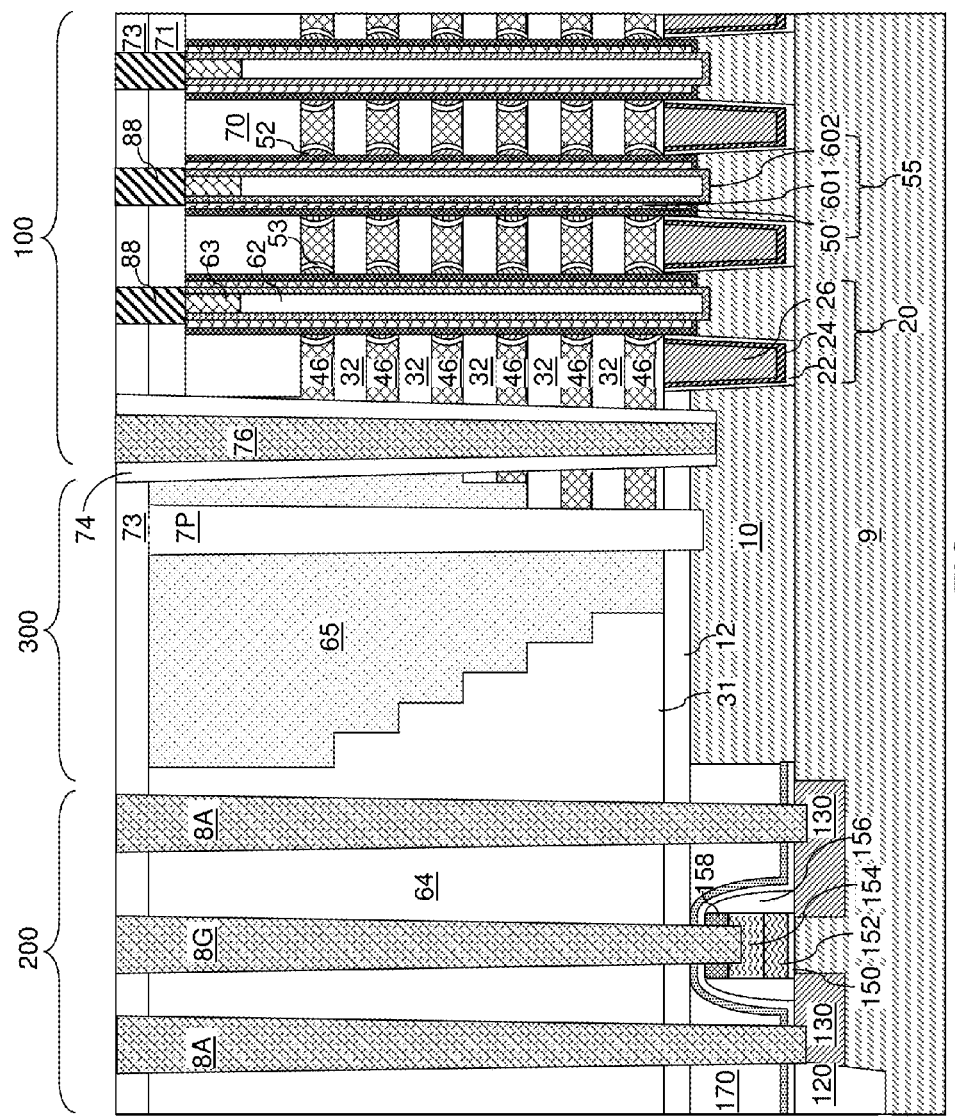
FIG. 9 is a vertical cross-sectional view of the exemplary structure after formation of a backside insulating spacer and a backside contact via structure according to an embodiment of the present disclosure.

Referring to FIG. 9, the deposited conductive material of the contiguous conductive material layer 46L is etched back from the sidewalls of each backside contact trench 79 and from above the dielectric pillar material layer 73 (or the topmost layer of the exemplary structure in case the dielectric pillar material layer 73 is not employed), for example, by an isotropic etch. Each remaining portion of the deposited conductive material in the backside recesses 43 constitutes an electrically conductive layer 46. Each electrically conductive layer 46 can be a conductive line structure.

Each electrically conductive layer 46 can function as a combination of a plurality of control gate electrodes and a word line electrically connecting, i.e., electrically shorting, the plurality of control gate electrodes. The plurality of control gate electrodes within each electrically conductive layer 46 can include control gate electrodes located at the same level for the vertical memory devices including the memory stack structures 55. In other words, each electrically conductive layer 46 can be a word line that functions as a common control gate electrode for the plurality of vertical memory devices.

An insulating spacer 74 can be formed on the sidewalls of the backside contact trench 79 by deposition of a contiguous dielectric material layer and an anisotropic etch of its horizontal portions. The insulating spacer 74 includes a dielectric material, which can comprise, for example, silicon oxide, silicon nitride, a dielectric metal oxide, a dielectric metal oxynitride, or a combination thereof. The thickness of the insulating spacer 74, as measured at a bottom portion thereof, can be in a range from 1 nm to 50 nm, although lesser and greater thicknesses can also be employed. In one embodiment, the thickness of the insulating spacer 74 can be in a range from 3 nm to 10 nm.

A photoresist layer (not shown) can be applied over the topmost layer of the exemplary structure (which can be, for example, the dielectric pillar material layer 73) and in the cavity laterally surrounded by the insulating spacer 74, and is lithographically patterned to form various openings in a peripheral device region. The locations and the shapes of the various openings are selected to correspond to electrical nodes of the semiconductor devices in the peripheral device region 200 to be electrically contacted by contact via structures. An anisotropic etch is performed to etch through the various layers overlying the electrical nodes of the semiconductor devices. For example, at least one gate via cavity can be formed such that the bottom surface of each gate via cavity is a surface of a gate electrode (152, 154), and at least one active region via cavity can be formed such that the bottom surface of each active region via cavity is a surface of an active region 130. In one embodiment, different types of via cavities can be formed separately employing multiple combinations of photoresist layers and anisotropic etch processes. The vertical extent of each gate via cavity, as measured from the top surface of the dielectric pillar material layer 73 to the bottom surface of the gate via cavity, can be less than the vertical distance between the top surface of the dielectric pillar material layer 73 and the topmost surface of the alternating plurality (32, 46) of the insulator layers 32 and the electrically conductive layers 46. The photoresist layer can be subsequently removed, for example, by ashing.

Another photoresist layer (not shown) can be applied over the exemplary structure, and can be lithographically patterned to form openings within the contact region 200 in which formation of contact via structures for the electrically conductive layers 46 is desired. Control gate contact via cavities can be formed through the retro-stepped dielectric material portion 65 by transfer of the pattern of the opening by an anisotropic etch. Each via cavity can vertically extend to a top surface of a respective electrically conductive layer 46.

In addition, another photoresist layer (not shown) can be applied over the exemplary structure, and can be lithographically patterned to form openings that overlie the array of drain regions 63 in the device region 100. Drain contact via cavities can be formed through the dielectric pillar material layer 73 and the at least one dielectric cap layer 71.

The cavity laterally surrounded by the insulating spacer 74, the various via cavities in the peripheral device region 200, the control gate contact via cavities in the contact region 300, and the drain contact via cavities in the device region 100 can be filled with a conductive material to form various contact via structures. For example, a backside contact via structure 76 can be formed in the cavity surrounded by the insulating spacer 74. A gate contact via structure 8G can be formed in each gate via cavity in the peripheral device region 200. An active region via structure 8A is formed in each active region via cavity in the peripheral device region 200. Drain contact via structures 88 can be formed in the drain contact via cavities in the device region 100. Further, control gate contact via structures (not shown) can be formed within each contact via cavity that extends to a top surface of the electrically conductive layers 46 in the contact region 300. Similarly, drain contact via structures 88 can be formed to provide electrical contact to the drain regions 63.

Figure 10A:
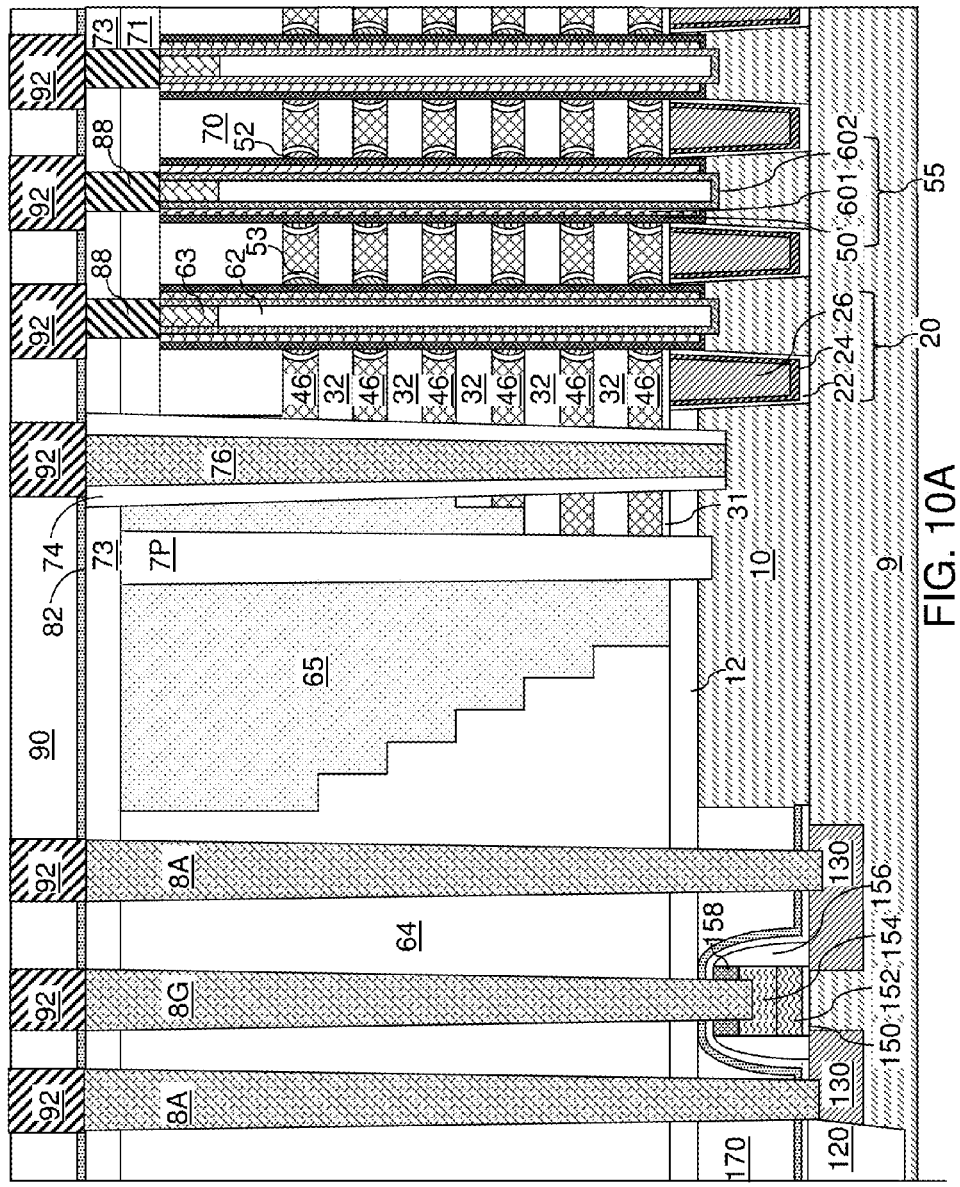
FIGS. 10A and 10B are vertical cross-sectional views of regions of the exemplary structure after formation of conductive line structures according to an embodiment of the present disclosure.
Figure 10B:
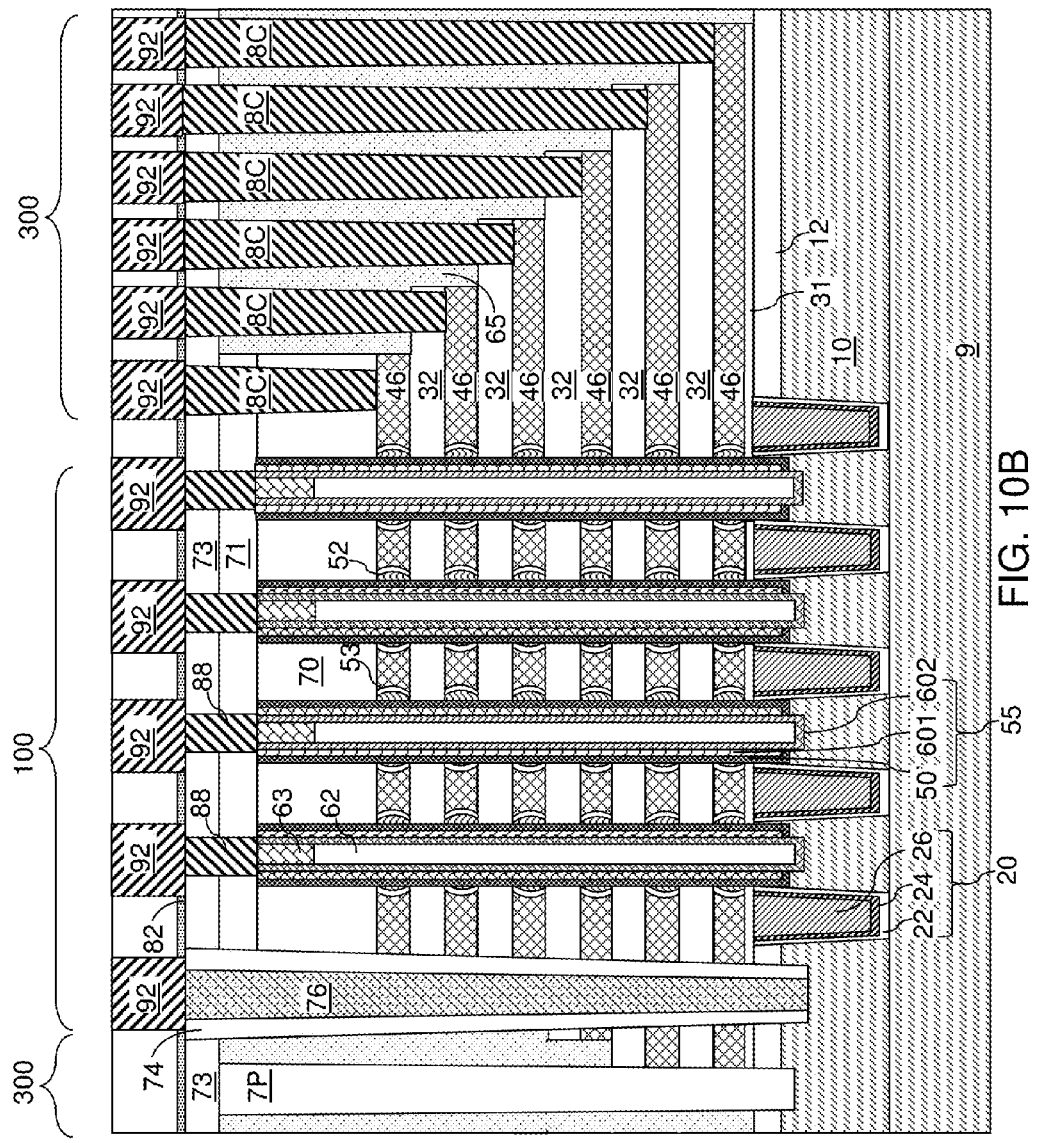

Referring to FIGS. 10A and 10B, an optional passivation layer 82 and a line-level dielectric layer 90 can be formed over the dielectric pillar material layer 73. The optional passivation layer 82 can include a low permeability material such as silicon nitride. As used herein, a low permeability material refers to a material that has hydrogen permeability at room temperature that is less than 100 times the hydrogen permeability of stoichiometric silicon nitride formed by low pressure chemical vapor deposition. The thickness of the passivation layer 82 can be in a range from 3 nm to 30 nm, although lesser and greater thicknesses can also be employed. The line-level dielectric layer 90 can include silicon oxide or organosilicate glass. The thickness of the line-level dielectric layer 90 can be in a range from 30 nm to 1,000 nm, although lesser and greater thicknesses can also be employed. Control gate contact via structures 8C contacting the electrically conductive layers 46 are illustrated in FIG. 9B.

Various conductive line structures 92 can be formed in the line-level dielectric layer 90 to provide electrical contact to the various contact via structures (76, 8G, 8A, 88, 8C). A subset of the electrically conductive layers 46 can function as control gate electrodes for the memory stack structures 55 in the device region. Optionally, at least one subset of the electrically conductive layers 46 can be employed as at least one drain select gate electrode and/or at least one source select gate electrode.

Additional metal interconnect structures (not shown) can be optionally formed, which can include at least one dielectric material layer, at least one conductive via structure, and at least one additional conductive line structure. The additional metal interconnect structure can be formed on the top surface of the conductive line structure 92 and the line-level dielectric layer 90.

The exemplary structure is a multilevel structure including a stack (32, 46) of an alternating plurality of electrically conductive layers 46 and insulator layers 32 located over a semiconductor substrate including the semiconductor material layer 10. An array of memory stack structures 55 can be located within memory openings through the stack (32, 46). Around each memory opening, a plurality of vertically spaced silicon-containing semiconductor portions 52 contacts an outer sidewall of the memory film 50. Further, a plurality of dielectric material portions 53 contacts a respective silicon-containing semiconductor portion 52, and is located at a same level as a respective electrically conductive layer 46 among a plurality of electrically conductive layers 46.

In one embodiment, the device located on the semiconductor substrate can include a vertical NAND device located in the device region 100, and at least one of the electrically conductive layers 46 in the stack (32, 46) can comprise, or can be electrically connected to, a word line of the NAND device. The device region 100 can include a plurality of semiconductor channels (601, 602). At least one end portion of each of the plurality of semiconductor channels (601, 602) extends substantially perpendicular to a top surface of the semiconductor substrate. The device region 100 further includes a plurality of charge storage regions located within each memory layer 50. Each charge storage region is located adjacent to a respective one of the plurality of semiconductor channels (601, 602). The device region 100 further includes a plurality of control gate electrodes having a strip shape extending substantially parallel to the top surface of the substrate (9, 10). The plurality of control gate electrodes comprise at least a first control gate electrode located in the first device level and a second control gate electrode located in the second device level. The plurality of electrically conductive layers 46 in the stack (32, 46) can be in electrical contact with, or can comprise, the plurality of control gate electrodes, and extends from the device region 100 to a contact region 200 including a plurality of electrically conductive contact via structures.

In case the exemplary structure includes a three-dimensional NAND device, a stack (32, 46) of an alternating plurality of word lines 46 and insulating layers 32 can be located over a semiconductor substrate. Each of the word lines 46 and insulating layers 32 is located at different levels that are vertically spaced from a top surface of the semiconductor substrate by different distances. An array of memory stack structures 55 is embedded within the stack (32, 46). Each memory stack structure 55 comprises a semiconductor channel (601, 602) and at least one charge storage region located adjacent to the semiconductor channel (601, 602). At least one end portion of the semiconductor channel (601, 602) extends substantially perpendicular to the top surface of the semiconductor substrate through the stack (32, 46).

In a non-limiting illustrative example, the insulating layers 32 can comprise silicon oxide layers, the plurality of word lines 46 can comprise tungsten or a combination of titanium nitride and tungsten, the at least one charge storage region can comprises a tunneling dielectric, a blocking dielectric layer, and either a plurality of floating gates or a charge trapping layer located between the tunneling dielectric layer and the blocking dielectric layer. An end portion of each of the plurality of word lines 46 in a device region can comprise a control gate electrode located adjacent to the at least one charge storage region. A plurality of contact via structures contacting the word lines 46 can be located in a contact region 300. The plurality of word lines 46 extends from the device region 100 to the contact region 300. The backside contact via structure 76 can be a source line that extends through a dielectric insulated trench, i.e., the backside contact trench 79 filled with the dielectric spacer 74 and the backside contact via structure 76, in the stack to electrically contact the source region (not shown). The source region can be in contact with the horizontal portion of the semiconductor channel in an upper portion of the semiconductor material layer 10.

A drain line, as embodied as a conductive line structure 92 that contacts a drain contact via structure 88, electrically contacts an upper portion of the semiconductor channel (601, 602). As used herein, a first element "electrically contacts" a second element if the first element is electrically shorted to the second element. An array of drain regions 63 contacts a respective semiconductor channel (601, 602) within the array of memory stack structures 55. A top surface of the dielectric material layer, i.e., the insulating cap layer 70, can be coplanar with top surfaces of the drain regions 63.

In one embodiment, the semiconductor channel (which includes a first semiconductor channel portion 601, a second semiconductor channel portion 602, and optionally a horizontal top portion of the semiconductor material layer 10 or a horizontal top portion of the semiconductor substrate 9) comprises a portion that vertically extends from a top surface of the substrate (9, 10) to a top surface of the stack (32, 46). In one embodiment, each memory film 50 can comprise a tunneling dielectric in contact with the semiconductor channel. In one embodiment, the memory film 50 can further comprise at least one charge storage region in contact with the tunneling dielectric. In one embodiment, a dielectric core comprising a dielectric oxide material can be present in each memory opening, and can be in contact with an inner sidewall of a semiconductor channel.

In one embodiment, each of the plurality of vertically spaced silicon-containing semiconductor portions 52 can have an annular shape. In one embodiment, each of the dielectric material portions 53 can include a dielectric material that is a compound of a semiconductor element within the plurality of vertically spaced silicon-containing semiconductor portions 52 and at least one element selected from oxygen and nitrogen.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a three-dimensional memory device, comprising:

forming a stack of alternating layers comprising first material layers and second material layers over a substrate;

forming a memory opening through the stack;

forming a memory film and a semiconductor channel in the memory opening;

forming backside recesses by removing the second material layers selective to the first material layers and the memory film, wherein an outer sidewall of the memory film is physically exposed within each backside recess;

forming a silicon-containing semiconductor portion over the memory film within each backside recess;

converting an outer portion of each silicon-containing semiconductor portion into a dielectric material portion, wherein a remaining portion of each silicon-containing semiconductor portion constitutes a floating gate electrode for the three-dimensional memory device; and forming conductive material layers by depositing a conductive material within the backside recesses, wherein the step of forming the silicon-containing semiconductor portion over the memory film within each backside recess comprises:

forming at least one set of surfaces selected from silicon deposition inhibiting surfaces on the first material layers and silicon deposition promoting surfaces over the memory film in the back side recesses; and selectively growing the silicon-containing semiconductor portions laterally within each backside recess.

2. The method of claim 1, wherein:

the silicon deposition inhibiting surfaces are formed on the first material layers and the silicon deposition promoting surfaces are formed on the memory film;

the silicon deposition inhibiting surfaces comprise —OCl terminated insulator surfaces; and the silicon deposition promoting surfaces comprise —SiSiH$_3$ terminated semiconductor surfaces.

3. The method of claim 2, further comprising:

forming in-process silicon-containing semiconductor portions having —SiCl terminated semiconductor surfaces on the physically exposed outer sidewalls of the memory film within the backside recesses; and exposing the —SiCl terminated semiconductor surfaces to an aminosilane gas to convert the —SiCl terminated semiconductor surface to the —SiSiH$_3$ terminated semiconductor surfaces.

4. The method of claim 3, wherein the step of forming the silicon-containing semiconductor portion over the memory film comprises selectively growing a silicon-containing semiconductor material on the —SiSiH$_3$ terminated semiconductor surface of the in-process silicon-containing semiconductor portion by chemical vapor deposition at a temperature less than 400 degrees Celsius.

5. The method of claim 3, wherein the in-process silicon-containing semiconductor portions having the —SiCl terminated semiconductor surfaces are formed by:

forming antecedent in-process silicon-containing semiconductor portions having —SiH terminated semiconductor surfaces directly on the physically exposed outer sidewalls of the memory film; and exposing the antecedent in-process silicon-containing semiconductor portions to a chlorine-containing gas, wherein the in-process silicon-containing semiconductor portions having —SiCl terminated semiconductor surfaces are formed.

6. The method of claim 5, wherein:

surfaces of the first material layers are formed with —OH termination in the backside recesses at a processing step of formation of the antecedent in-process silicon-containing semiconductor portions; and surfaces of the first material layers are converted into —OCl terminated insulator surfaces upon exposure to the chlorine-containing gas.

7. The method of claim 1, wherein the silicon deposition inhibiting surfaces comprising —OSi(CH$_3$)$_3$ terminated insulator surfaces are formed on the first material layers.

8. The method of claim 7, wherein:

the physically exposed outer surfaces of the memory film are —NH terminated surfaces;

the first material layers have —OH terminated insulator surfaces in the back side recesses; and the method further comprises:

exposing the —NH terminated surfaces and the —OH terminated insulator surfaces to a silylation agent containing an —Si(CH$_3$)$_3$ group to convert the —OH terminated insulator surfaces to —OSi(CH$_3$)$_3$ terminated insulator surfaces while the —NH terminated surfaces maintain —NH termination; and selectively growing the silicon-containing semiconductor portions on the —NH terminated surfaces of the memory film within each backside recess, while the silicon-containing semiconductor portions do not grow from the —OSi(CH$_3$)$_3$ terminated insulator surfaces.

9. The method of claim 8, further comprising:

cleaning the physically exposed outer surfaces of the memory film and surfaces of the first material layers with hydrofluoric acid prior to exposure to the sylilation agent; and drying the —OH terminated insulator surfaces and —NH terminated surfaces of the memory film with isopropyl alcohol after exposure to the silylation agent;

wherein the —NH terminated surfaces are surfaces of a silicon nitride layer, the —OSi(CH$_3$)$_3$ terminated insulator surfaces are surfaces of silicon oxide layers, and the silicon-containing semiconductor portion is an amorphous silicon portion.

10. The method of claim 1, wherein:

the physically exposed outer sidewalls of the memory film are silicon nitride surfaces;

the first material layers comprise silicon oxide layers; and the silicon-containing semiconductor portions are amorphous silicon portions.

11. The method of claim 1, wherein:

the memory film comprises a tunneling dielectric or a combination of a dielectric charge trapping layer and a tunneling dielectric;

the floating gate electrode is thicker in its middle portion than in its upper and lower end portions;

the dielectric material portion comprises a blocking dielectric which is formed employing at least one process selected from thermal oxidation, thermal nitridation, plasma oxidation, plasma nitridation, and a combination thereof;

the device comprises a vertical NAND device; and the conductive material layers in the stack comprise, or are electrically connected to, a word line of the vertical NAND device.

12. The method of claim 11, wherein:

the NAND device comprises:

a plurality of semiconductor channels, wherein at least one end portion of each of the plurality of semiconductor channels extends substantially perpendicular to a top surface of the substrate;

a plurality of floating gate electrodes; and a plurality of control gate electrodes having a strip shape extending substantially parallel to a top surface of the substrate;

the plurality of control gate electrodes comprise at least a first control gate electrode located in the first device level and a second control gate electrode located in the second device level;

the conductive material layers in the stack comprise, or are in electrical contact with, the plurality of control gate electrodes and extend from the device region to a contact region containing a plurality of electrically conductive via connections; and the substrate comprises a silicon substrate containing a driver circuit for the NAND device.

13. A method of forming a three-dimensional memory device, comprising:

forming a stack of alternating layers comprising first material layers and second material layers over a substrate;

forming a memory opening through the stack;

forming a memory film and a semiconductor channel in the memory opening;

forming backside recesses by removing the second material layers selective to the first material layers and the memory film, wherein an outer sidewall of the memory film is physically exposed within each backside recess;

forming at least one set of surfaces selected from silicon deposition inhibiting surfaces on the first material layers and silicon deposition promoting surfaces over the memory film in the back side recesses;

selectively growing a silicon-containing semiconductor portion laterally within each backside recess;

forming at least one blocking dielectric within the backside recesses; and forming conductive material layers by depositing a conductive material within the backside recesses.

14. The method of claim 13, wherein:

the silicon deposition inhibiting surfaces are formed on the first material layers and the silicon deposition promoting surfaces are formed on the memory film;

the silicon deposition inhibiting surfaces comprise —OCl terminated insulator surfaces; and the silicon deposition promoting surfaces comprise —SiSiH$_3$ terminated semiconductor surfaces.

15. The method of claim 14, further comprising:

forming in-process silicon-containing semiconductor portions having —SiCl terminated semiconductor surfaces on the physically exposed outer sidewalls of the memory film within the backside recesses; and exposing the —SiCl terminated semiconductor surfaces to an aminosilane gas to convert the —SiCl terminated semiconductor surface to the —SiSiH$_3$ terminated semiconductor surfaces.

16. The method of claim 15, wherein the step of selectively growing the silicon-containing semiconductor portion comprises selectively growing a silicon-containing semiconductor material on the —SiSiH$_3$ terminated semiconductor surface of the in-process silicon-containing semiconductor portions by chemical vapor deposition at a temperature less than 400 degrees Celsius.

17. The method of claim 16, wherein the in-process silicon-containing semiconductor portions having the —SiCl terminated semiconductor surfaces are formed by:

forming antecedent in-process silicon-containing semiconductor portions having —SiH terminated semiconductor surfaces directly on the physically exposed outer sidewalls of the memory film; and exposing the antecedent in-process silicon-containing semiconductor portions to a chlorine-containing gas, wherein the in-process silicon-containing semiconductor portions having —SiCl terminated semiconductor surfaces are formed.

18. The method of claim 16, wherein:

surfaces of the first material layers are formed with —OH termination in the backside recesses at a processing step of formation of the antecedent in-process silicon-containing semiconductor portions; and surfaces of the first material layers are converted into —OCl terminated insulator surfaces upon exposure to the chlorine-containing gas.

19. The method of claim 13, wherein the silicon deposition inhibiting surfaces comprising —OSi(CH$_3$)$_3$ terminated insulator surfaces are formed on the first material layers.

20. The method of claim 19, wherein:

the physically exposed outer surfaces of the memory film are —NH terminated surfaces;

the first material layers have —OH terminated insulator surfaces in the back side recesses; and the method further comprises:

exposing the —NH terminated surfaces and the —OH terminated insulator surfaces to a silylation agent containing a —Si(CH$_3$)$_3$ group to convert the —OH terminated insulator surfaces to —OSi(CH$_3$)$_3$ terminated insulator surfaces while the —NH terminated surfaces maintain —NH termination; and selectively growing the silicon-containing semiconductor portions on the —NH terminated surfaces of the memory film within each backside recess, while the silicon-containing semiconductor portions do not grow from the —OSi(CH$_3$)$_3$ terminated insulator surfaces.

21. The method of claim 20, further comprising:

cleaning the physically exposed outer surfaces of the memory film and surfaces of the first material layers with hydrofluoric acid prior to exposure to the silylation agent; and drying the —OH terminated insulator surfaces and —NH terminated surfaces of the memory film with isopropyl alcohol after exposure to the silylation agent;

wherein the —NH terminated surfaces are surfaces of a silicon nitride layer, the —OSi(CH$_3$)$_3$ terminated insulator surfaces are surfaces of silicon oxide layers, and the silicon-containing semiconductor portion is an amorphous silicon portion.

22. The method of claim 13, wherein:

the physically exposed outer sidewalls of the memory film are silicon nitride surfaces;

the first material layers comprise silicon oxide layers; and the silicon-containing semiconductor portions are amorphous silicon portions.

23. The method of claim 13, wherein:

the memory film comprises a tunneling dielectric or a combination of a dielectric charge trapping layer and a tunneling dielectric;

the floating gate electrode is thicker in its middle portion than in its upper and lower end portions;

the dielectric material portion comprises a blocking dielectric which is formed employing at least one process selected from thermal oxidation, thermal nitridation, plasma oxidation, plasma nitridation, and a combination thereof;

the device comprises a vertical NAND device; and the conductive material layers in the stack comprise, or are electrically connected to, a word line of the vertical NAND device.

24. The method of claim 23, wherein:

The vertical NAND device comprises:

a plurality of semiconductor channels, wherein at least one end portion of each of the plurality of semiconductor channels extends substantially perpendicular to a top surface of the substrate;

a plurality of floating gate electrodes; and a plurality of control gate electrodes having a strip shape extending substantially parallel to a top surface of the substrate;

the plurality of control gate electrodes comprise at least a first control gate electrode located in the first device level and a second control gate electrode located in the second device level;

the conductive material layers in the stack comprise, or are in electrical contact with, the plurality of control gate electrodes and extend from the device region to a contact region containing a plurality of electrically conductive via connections; and the substrate comprises a silicon substrate containing a driver circuit for the NAND device.

25. A method of forming a three-dimensional memory device, comprising:

forming a stack of alternating layers comprising first material layers and second material layers over a substrate;

forming a memory opening through the stack;

forming a memory film and a semiconductor channel in the memory opening;

forming backside recesses by removing the second material layers selective to the first material layers and the memory film, wherein an outer sidewall of the memory film is physically exposed within each backside recess;

forming a silicon-containing semiconductor portion over the memory film within each backside recess;

converting an outer portion of each silicon-containing semiconductor portion into a dielectric material portion, wherein a remaining portion of each silicon-containing semiconductor portion constitutes a floating gate electrode for the three-dimensional memory device; and forming conductive material layers by depositing a conductive material within the backside recesses, wherein:

silicon deposition inhibiting surfaces are formed on the first material layers and silicon deposition promoting surfaces are formed on the memory film;

the silicon deposition inhibiting surfaces comprise —OCl terminated insulator surfaces; and the silicon deposition promoting surfaces comprise —SiSiH$_3$ terminated semiconductor surfaces.

26. A method of forming a three-dimensional memory device, comprising:

forming a stack of alternating layers comprising first material layers and second material layers over a substrate;

forming a memory opening through the stack;

forming a memory film and a semiconductor channel in the memory opening;

forming backside recesses by removing the second material layers selective to the first material layers and the memory film, wherein an outer sidewall of the memory film is physically exposed within each backside recess;

forming a silicon-containing semiconductor portion over the memory film within each backside recess;

converting an outer portion of each silicon-containing semiconductor portion into a dielectric material portion, wherein a remaining portion of each silicon-containing semiconductor portion constitutes a floating gate electrode for the three-dimensional memory device; and forming conductive material layers by depositing a conductive material within the backside recesses, wherein silicon deposition inhibiting surfaces comprising —OSi(CH$_3$)$_3$ terminated insulator surfaces are formed on the first material layers.

* * * * *